US012760443B2

(12) United States Patent
Wei et al.

(10) Patent No.: US 12,760,443 B2
(45) Date of Patent: Oct. 13, 2026

(54) SILICON CARBIDE HETEROJUNCTION NORMALLY-OFF HIGH-ELECTRON-MOBILITY TRANSISTOR AND METHOD FOR PREPARING THE SAME

(71) Applicant: Wenzhou University, Wenzhou City (CN)

(72) Inventors: Wensheng Wei, Wenzhou City (CN); Senrong Dai, Wenzhou City (CN); Jingyang Ding, Wenzhou City (CN); Zisheng Wang, Wenzhou City (CN); Chenfei Yang, Wenzhou City (CN)

(73) Assignee: WENZHOU UNIVERSITY, Wenzhou City (CN)

( * ) Notice: Subject to any disclaimer, the term of this patent is extended or adjusted under 35 U.S.C. 154(b) by 360 days.

(21) Appl. No.: 18/568,270

(22) PCT Filed: Sep. 19, 2022

(86) PCT No.: PCT/CN2022/119679
§ 371 (c)(1),
(2) Date: Dec. 7, 2023

(87) PCT Pub. No.: WO2024/050867
PCT Pub. Date: Mar. 14, 2024

(65) Prior Publication Data
US 2025/0092567 A1 Mar. 20, 2025

(30) Foreign Application Priority Data
Sep. 5, 2022 (CN) ......................... 202211080038.5

(51) Int. Cl.
*C30B 25/20* (2006.01)
*C23C 14/18* (2006.01)
(Continued)

(52) U.S. Cl.
CPC .............. *C30B 25/20* (2013.01); *C23C 14/18* (2013.01); *C23C 14/30* (2013.01); *C30B 25/186* (2013.01);
(Continued)

(58) Field of Classification Search
CPC ....... C23C 14/18; C23C 14/30; C30B 25/186; C30B 25/20; C30B 29/36; C30B 31/22;
(Continued)

(56) References Cited

U.S. PATENT DOCUMENTS 6,221,700 B1 * 4/2001 Okuno ................... H10D 30/63
257/E21.057

OTHER PUBLICATIONS

Zhao, Growth of high-quality 4H-SiC epitaxial layers on 4° off-axis C-face 4H-SiC substrates, Journal of Crystal Growth, vol. 531 (Year: 2020).*

(Continued)

*Primary Examiner* — Leonard Chang
*Assistant Examiner* — Nimarta Kaur Chowdhary
(74) *Attorney, Agent, or Firm* — Leong C. Lei

(57) ABSTRACT

A method for preparing a silicon carbide heterojunction normally-off high-electron-mobility transistor includes selecting an unintentionally doped n-type 4H-SiC chip as a substrate; growing a 4H-SiC transition layer on the substrate through isomorphic epitaxial growth, and growing a C face on the 4H-SiC transition layer through epitaxial growth; growing an unintentionally doped 3C-SiC potential well layer on the C face; growing an n-type doped 4H-SiC barrier layer on the 3C-SiC potential well layer, and growing a Si face on the 4H-SiC barrier layer through epitaxial growth; growing an unintentionally doped 3C-SiC cap layer on the Si face; and producing electrodes and protective films, so as to obtain a 3C-SiC/4H-SiC heterojunction normally-off single-channel high-electron-mobility transistor. The (Continued)

method allows both sides of the SiC heterojunction interface to have homogeneous elements during preparation, thereby eliminating diffusive contamination and reducing process complexity.

10 Claims, 16 Drawing Sheets

(51) Int. Cl.

| | |
|---|---|
| ***C23C 14/30*** | (2006.01) |
| ***C30B 25/18*** | (2006.01) |
| ***C30B 29/36*** | (2006.01) |
| ***C30B 31/22*** | (2006.01) |
| ***C30B 33/12*** | (2006.01) |
| ***H10D 30/01*** | (2025.01) |
| ***H10P 14/20*** | (2026.01) |

(52) U.S. Cl.
CPC .............. *C30B 29/36* (2013.01); *C30B 31/22* (2013.01); *C30B 33/12* (2013.01); *H10D 30/015* (2025.01); *H10P 14/3408* (2026.01)

(58) Field of Classification Search
CPC .... C30B 33/12; H10D 30/015; H10D 30/473; H10D 30/474; H10D 62/151; H10D 62/40; H10D 62/8325; H10D 64/258; H10P 14/24; H10P 14/2904; H10P 14/3208; H10P 14/3408
See application file for complete search history.

(56) References Cited

OTHER PUBLICATIONS

Triendl , Growth and characterization of low pressure chemical vapor deposited Si on Si-face 4H-SiC, Materials Science in Semiconductor Processing, vol. 131. (Year: 2021).*
Li, Double-Position-Boundaries Free 3C-SiC Epitaxial Layers Grown on On-Axis 4H-SiC, ECS Journal of Solid State Science and Technology, vol. 3 (Year: 2014).*

* cited by examiner

SILICON CARBIDE HETEROJUNCTION NORMALLY-OFF HIGH-ELECTRON-MOBILITY TRANSISTOR AND METHOD FOR PREPARING THE SAME

BACKGROUND OF THE INVENTION

1. Technical Field

The present invention relates to power semiconductors, and more particularly to a silicon carbide (SiC) heterojunction normally-off high-electron-mobility transistor (HEMT) and a method for preparing the same.

2. Description of Related Art

About Group III-V direct bandgap semiconductor heterojunction HEMTs, significant achievements have been acquired in both research and applications. Particularly, (p)AlGaN/(i)GaN heterojunction normally-off lateral field effect transistors were prepared and investigated for working principles thereof [Y. Uemoto, M. Hikita, H. Ueno, et al., IEEE Transactions on Electron Devices, Vol. 54, No. 12 (2007): 3393-3399.]. In such a known HFET, a two-dimensional electron gas (2DEG) channel is formed in virtue of the spontaneous, piezoelectric polarization effects of the AlGaN/GaN heterojunction, and a gate (G) is created through evaporation at the AlGaN side of the AlGaN/GaN heterojunction where a (p) GaN layer has been grown. Since the majority carriers in the (p)GaN layer are holes, this helps increase barrier in the conduction band in the channel below the gate (G). When the gate (G) voltage $V_g$=0, the 2DEG in the channel below the (p)GaN layer is completely depleted, and the device is in a normally-off state. When $V_g$ increases forward and exceeds the built-in potential ($V_{bi}$) of the (p)GaN/(p)AlGaN heterojunction, holes enter the channel form the gate (G) via the (p)GaN layer. Otherwise, electrons enter the gate (G) from the channel via the (p)GaN layer and get suppressed by the (p)GaN/(p)AlGaN heterojunction barrier. For electric neutrality, holes enter the channel from the gate (G) via the (p)GaN layer. Since holes are less mobile, they will be combined with some channel electrons to induce conductivity modulation. Meanwhile, only when equivalent electrons accumulated at the source (S) are attracted by the drain (D) biased by the forward voltage to pass the 2DEG channel with high mobility and a drain (D) current $I_d$ is formed consequently, the device can work normally. In the device, a P-type GaN layer is arranged below the gate (G) and holes are injected into the channel, so the consequent conductivity modulation at the channel leads to significantly increased $I_d$ while $I_g$ remains small. In addition, with controllable lattice mismatch between (p)GaN and (p)AlGaN inserted below the gate (G), any defect of the gate (G) will not have meaningful impact on transport through the AlGaN/GaN heterojunction channel 2DEG, making current collapse of the HFET ignorable.

A metal-AlGaN/GaN heterojunction two-dimensional electron gas Schottky junction tunneling normally-off lateral field effect transistor has been reported and explained for working principles thereof [H. Chen, L. Yuan, K. J. Chen, Phys. Status Solidi C, Vol. 9, No. 3-4 (2012): 871-874.]. Such a known TJ-FET has a 2DEG channel formed by the spontaneous, piezoelectric polarization effect of the AlGaN/GaN heterojunction. At one end of the channel, an alloy (e.g., TiAu) film is deposited to form a Schottky junction, and an ohmic-contact electrode is formed on the alloy film as the source S. An insulating layer of an oxide (e.g., $Al_2O_3$) is deposited on the AlGaN layer, and then a gate of an alloy (e.g., NiAu) is made. This gate G overlaps the underlying Schottky junction, so as to prevent formation of any lateral gap between the gate G and the Schottky junction that prevents the gate G voltage from controlling transport of charges through the Schottky junction. An ohmic contact alloy (e.g., TiAlNiAu) is deposited as a film to form a drain at the other end of the heterojunction 2DEG channel through evaporation. When the gate G voltage $V_g$<0, the 2DEG in the channel below the gate G is depleted, and the channel is cut off. At this time, the Schottky junction barrier is very high, and the lateral thickness is very large. As charges cannot move from the source S tunneling Schottky barrier to the drain D, the current $I_d$ at the drain D is 0. When $V_g$=0, the 2DEG channel below the gate G is on. However, the high Schottky junction barrier and the large lateral thickness prevent charges from moving from the source S tunneling Schottky barrier to the drain D, so the $I_d$ is ignorable. When $V_g$ increases forward to a certain extent, the Schottky junction barrier is very low and the lateral thickness is very small, allowing charges to come to the drain D from the source S tunneling Schottky barrier, and $I_d$ is quite high. This TJ-FET uses the forward voltage at the gate G to make the electron-tunneling Schottky barrier at the source S reach the drain D, so as to form $I_d$, thereby implementing enhancement. Since $I_d$ is obtained by controlling the electron-tunneling Schottky barrier of the source S to reach the drain D using $V_g$, the device has a very small specific on resistance $R_{on-sp}$. When $V_g$≤0, $I_d$=0. Therefore, the TJ-FET has a breakdown voltage $V_B$ significantly higher than that of the traditional HEMT.

There has not been a SiC heterojunction HEMT reported. SiC semiconductors feature stable chemical properties, wide bandgaps, high thermal conductivity, high critical breakdown electric field intensity, high carrier saturated drift velocity, and good resistance against radiation and corrosion. SiC is present in more than 100 different crystal structures, such as 3C-SiC, 4H-SiC, 6H-SiC, and so on. A 3C-SiC cell has four C-Si equivalent bonds, while a 4H-SiC or 6H-SiC cell has one preferential bond (with its direction defined as the c axis) and the other bonds in different directions are not equivalent, so as to cause spontaneous polarization. Additionally, heterojunctions (e.g., 3C/(4, 6) h-SiC, (4, 6) h/3C/(4, 6) h-SiC, etc.) formed by SiC materials different in band gap ($E_g$), in crystal form, or in crystal plane atom may be used to achieve desired transport of charger carriers and photons. In SiC materials having different crystal forms, lattice constant and thermal conductivity are relatively consistent in directions a and b, so the piezoelectric polarization effect at the resulting heterojunction interface is weak opposite to the case of a group-III nitride semiconductor heterojunction. SiC materials have similar chemical compositions (all composed of Si and C) even when having different crystal forms. This eliminates diffusive contamination of chemical components at a heterojunction between two SiC materials. Therefore, a SiC heterojunction has novel electrical, optical, and thermal properties, and is suitable for applications where high frequency, high temperature, high pressure, high power, low noise, and good resistance to corrosion are of concern, making it a subject that has high R&D value, promising application prospect, and high market potential.

About SiC heterojunctions, the underlying principles of their growth and experimental preparation have been reported. Growth of a SiC heterojunction is mainly achieved using chemical vapor transportation such as molecular beam epitaxy (MBE), epitaxy under vacuum (SEV), physical vapor transportation (PVT), chemical vapor deposition (CVD), and vapor-liquid-solid growth (VLS). The research group led by XU Peng-Shou in University of Science and Technology of China made a 6H/3C/6H-SiC multi-layer on the 6H-SiC (0001) face of a 1350K substrate using solid-source molecular beam epitaxy (SSMBE) [LIU Jin-Feng, L I U Zhong-Liang, X U Peng-Shou et. al., Journal of Chemical Physics, Vol. 24 (2008): 571-575.]. The known heterojunction was grown in three stages: (1) when the Si flow was slightly excessive, the growth was in a two-dimensional step flow mode, where the epitaxial film remained the same crystal form as the substrate; (2) when the Si flow was then lowered, the growth turned to three-dimensional island growth; and (3) when the Si flow was restored to the initial, slightly excessive supply, the growth mode returned to two-dimensional step flow growth. The research group led by ZHANG Yu-Ming in Xidian University formed a 3C/4H-SiC heterojunction on a 1770 K temperature on-axis 4H-SiC (0001) Si-face substrate through formation of a stepwise hetero-epitaxial 3C-SiC film using hot-wall chemical vapor deposition (HWCVD) and mixed reaction gas ($SiH_4$+$C_3H_8$+$H_2$) [B. Xin, R. X. Jia, Y. M. Zhang, et al., Applied Surface Science, Vol. 357 (2015): 985-993.]. German researchers, A. Fissel, et al., made a (4,6) h/3C/(4,6) h-SiCmulti-layer on a (4, 6) h-SiC substrate using SSMBE[A. Fissel, Physics Reports, Vol. 379 (2003): 149-255.], and grew a 3C-SiC film on a 1430 K on-axis substrate (4, 6) h-SiC (0001) by alternating C and Si sources during growth with a well-controlled twin boundary of the (4, 6) h/3C-SiC interface and a 3C-SiC layer having improved quality. Russian researchers, A. A. Lebedev, et al., developed a 3C/6H-SiC mutated heterojunction using SEV [A. A. Lebedev, et al., Journal of Crystal Growth, Vol. 396 (2014): 100-103.]. To grow 3C-SiC on the Si face of a substrate 6H-SiC (0001) required a temperature of 2270 K and the growth rate above 0.7 μm/min; and to grow 3C-SiC on the C ($000\bar{1}$) face of a 6H-SiC substrate required a temperature of 2120~2170 K, and the growth rate of 0.4~0.5 μm/min. The peaks 2.9 eV and 2.3 eV in the electroluminescence spectrum corresponded to the bandgaps of 6H-SiC and 3C-SiC, respectively. French researchers, J. Lorenzzi, et al., used a water-based cold-wall CVD system and mixed gas of different formulas to make 3C/6H-SiC heterojunctions on on-axis and 2-degree-off-axis 6H-SiC (0001) Si-face substrates and investigated into VLS for 3C-SiC epitaxial growth [J. Lorenzzi, et al., Diamond & Related Materials, Vol. 20 (2011): 808-813.].

More studies have been made on SiC heterojunctions for their novel electrical, optical, and thermal properties. XIE Xi-De, et. al. of Fudan University, Chian, used the LMTO-ASA ab initio energy band method to identify the electronic structure and the band structure of superlattices at $(3C\text{-}SiC)_{3n}/(2H\text{-}SiC)_{2n}$ (n=1, 2, 3) heterojunctions [X. D. Xie, et al., Physical Review B, Vol. 54 (1996): 8789-8793.], and the results indicated that a 3C/2H-SiC heterojunction had a type-II energy band, a conduction band offset $\Delta E_c$=1.48 eV, and valence band offset $\Delta E_v$=0.13 eV, with the bandgap decreased rapidly with increase of the overall thickness, which was believed to be related to the internal electric field caused by 2H-SiC spontaneous polarization, yet the electric field had little impact on band offsets $\Delta E_c$ and $\Delta A_v$. Russian scientists, S. Yu. Davydov, et al. measured how the spontaneous polarization effect impacted the energy level of a (4, 6) h/3C/(4, 6) h-SiC heterojunction quantum well [S. Yu. Davydov, et al., Physics of the Solid State, Vol. 53 (2011): 872-877; S. Yu. Davydov, et al., Semiconductors, Vol. 53 (2019): 699-702.]. Particularly, they solved Poisson Equation and Schrödinger Equation in a self-consistent manner by setting boundary conditions, so as to get an energy level expression for quantum wells at a SiC heterojunction. Simulative calculation demonstrated that spontaneous polarization narrowed and deepened the quantum well at the left interface of a (4, 6) h/3C/(4, 6) h-SiC heterojunction, and widened and shallowed the quantum well at the right interface. Electrons moved from the quantum wells in the 3C-SiC region directly to the valence band in the (4, 6) h-SiC region. When the 3C-SiC was very thin, electrons moved from the left conduction band quantum well indirectly to the valence band at the right interface. US scientists, M. V. S. Chandrashekhar, et. al made a 4H($000\bar{1}$)C face/3C-SiC heterojunction using cold-wall CVD [M. V. S. Chandrashekhar, et al., Applied Physics Letters, Vol. 91 (2007): 033503-1-3.]. In the interface quantum wells of this heterojunction, the 3C-SiC side had two-dimensional electron gas (2DEG), with its mobility up to 314 $cm^2 \cdot V^{-1} \cdot s^{-1}$ and surface density up to $3\times10^{13}$ $cm^{-2}$. M. V. S. Chandrashekhar further prepared a 4H ($000\bar{1}$) Si face/3C-SiC heterojunction [M. V. S. Chandrashekhar, et al., Applied Physics Letters, Vol. 90 (2007): 173509-1-4.], wherein 4H-SiC spontaneous polarization induced positive charges at the 3C-SiC side to form interface two-dimensional hole gas (2DHG), with a surface density up to $9.7\times10^{12}$ $cm^{-2}$. This is because spontaneous polarization induced a large amount of 2DHG. US scientists S. Bai, et. al. prepared 4H/3C/4H-SiC single quantum well at the temperature of 1820 K using hot-wall CVD [S. Bai, et al., Applied Physics Letters, Vol. 83 (2003): 3171-3173.]. According to a low-temperature PL spectrum at 2K, the light-emitting energy of the quantum well was 0.2 eV lower than the bandgap of the 3C-SiC body material, attributable to light-emitting redshift at quantum wells caused by the quantum-confined Stark effect resulted from the electric field induced by 4H-SiC spontaneous polarization. Accordingly, the intensity of 4H-SiC spontaneous polarization was calculated. US scientists Jie Lu, et. al formed a 6H($0000\bar{1}$)C face/3C-SiC heterojunction by depositing 3C-SiC on the C face of a substrate 6H-SiC (0001) using a cold-wall CVD system [J. Lu, et al., Applied Physics Letters, Vol. 94 (2009): 162115-1-3.]. Their analysis suggested that, between the 6H-SiC (0001) face and 3C-SiC (111), lattice mismatch was below 0.1%, and thermal mismatch was less than 0.1%. The measurements of magnetotransport in the 0-10 T magnetic field and in the temperature range of 1.5-100 K indicated that the heterojunction interface had 2DEG, with its mobility of 2000 $cm^2 \cdot V^{-1} \cdot s^{-1}$, and its surface density of $(2.7\pm0.2)\times10^{12}$ $cm^{-2}$.

When the magnetic field remained unchanged, the longitudinal magnetoresistance $R_{xx}$ decreased as the temperature increased. When the temperature was below 30 K, $R_{xx}$ decreased first and then increased as the magnetic field increased. When the temperature was high than 30K, $R_{xx}$ increased with increase of the magnetic field.

To date, some SiC heterojunction devices and performance thereof have been reported. For example, R. A. Minamisawa et. al. prepared a 3C/4H-SiC heterojunction Schottky barrier diode (SBD) using an HWCVD method [R. A. Minamisawa, et al., Applied Physics Letters, Vol. 108 (2016): 143502-1-3.], with a forward voltage $V_{on}$=1.65 V and a leakage current satisfying the field emission mechanism. The SBD had better thermal stability as compared to Si/SiC heterojunction SBDs prepared using CVD and MBE. The inventors of the present invention have designed a terahertz wave band SiC heterojunction impact ionization avalanche transit-time (IMPATT) diode [W. S. Wei, et al., Superlattices and Microstructures, Vol. 152 (2021): 106844-1-12.]. Based on digital simulation, impact of the SiC heterojunction barrier and material properties on the performance of the device in terms of direct current and large signal before and after correction of quantum effects (i.e., tunneling, the Bohm potential) were analyzed, and different heterojunction IMPATT diodes were compared in terms of power, efficiency, and noise.

Based on all the foregoing researches and studies, with the consideration of basic match of lattices in a and b directions at a 3C/4H(6H)-SiC heterojunction interface, with the piezoelectric polarization effect ignored, in such a heterojunction interface the only thing to be considered is interface 2DEG and 2DHG incurred by spontaneous polarization of hexagonal SiC, without the need of considering the interface piezoelectric polarization effect. Hence, there is a need for such a heterojunction device that minimizes interface 2DEG and 2DHG interference at the interface, so as to eliminate diffusive contamination across two sides of the heterojunction interface and reduce process complexity. Therefore, as compared to a device having a group-III nitride heterojunction that causes spontaneous, piezoelectric polarization, the disclosed SiC heterojunction device is simpler and more reliable.

SUMMARY OF THE INVENTION

Embodiments of the present invention solve the technical problems of the prior art by providing a silicon carbide (SiC) heterojunction normally-off high-electron-mobility transistor (HEMT) and a method for preparing the same. The method allows two sides of the SiC heterojunction interface have homogeneous elements during preparation, thereby eliminating diffusive contamination, simplifying manufacturing, and improving device performance.

To this end, in an embodiment of the present invention, a method for preparing a SiC heterojunction normally-off HEMT comprises the following steps:

S11, selecting an unintentionally doped n-type 4H-SiC chip as a substrate;

S12, growing a 4H-SiC transition layer on an upper surface of the substrate through isomorphic epitaxial growth, and growing a C face on an upper surface of the 4H-SiC transition layer through epitaxial growth;

S13, growing an unintentionally doped 3C-SiC potential well layer on the C face of the 4H-SiC transition layer;

S14, growing an n-type doped 4H-SiC barrier layer on an upper surface of the 3C-SiC potential well layer, and growing a Si face on an upper surface of the 4H-SiC barrier layer through epitaxial growth;

S15, growing an unintentionally doped 3C-SiC cap layer on the Si face of the 4H-SiC barrier layer; and S16, producing electrodes and protective films, so as to obtain a 3C-SiC/4H-SiC heterojunction normally-off single-channel high-electron-mobility transistor.

Therein, the step S11 is achieved by:

taking the unintentionally doped n-type 4H-SiC chip, which is on-axis or is off-axis by a predetermined angle, as the substrate, and etching a growth face of the 4H-SiC chip using hydrogen under a first predetermined temperature and a predetermined pressure in a reaction chamber of a hot-wall chemical vapor deposition (HWCVD) system, so as to remove dangling bonds, surface scratches, and smears.

Therein, the step S12 is achieved by:

in the reaction chamber of the HWCVD system, under the first predetermined temperature and the predetermined pressure, with a first mixed gas formed by supplying silane ($SiH_4$), propane ($C_3H_8$), hydrogen ($H_2$), and phosphine ($PH_3$) as a doping gas, growing the 4H-SiC transition layer, which is isomorphous to the substrate on the etched growth face of the substrate, through isomorphic epitaxial growth, and growing the C face on the upper surface of the 4H-SiC transition layer through two-dimensional epitaxial growth; and when a thickness of the 4H-SiC transition layer reaches a first predetermined thickness value, cutting off supply of silane ($SiH_4$), propane ($C_3H_8$), and phosphine ($PH_3$) as the doping gas to the first mixed gas, so as to keep etching the upper surface of the 4H-SiC transition using hydrogen ($H_2$).

Therein, the step S13 is achieved by:

in the reaction chamber of the HWCVD system, under a second predetermined temperature and the predetermined pressure, with a second mixed gas formed by supplying silane ($SiH_4$), propane ($C_3H_8$), and hydrogen ($H_2$), growing the unintentionally doped 3C-SiC potential well layer on the C face of the 4H-SiC transition layer through three-dimensional island growth; and when a thickness of the 3C-SiC potential well layer reaches a second predetermined thickness value, cutting off supply of silane ($SiH_4$) and propane ($C_3H_8$) to the second mixed gas, so as to keep etching the upper surface of the 3C-SiC potential well layer using hydrogen ($H_2$);

whereby the 3C-SiC potential well layer and the C face 4H-SiC transition layer form a SiC heterojunction interface, thereby exciting a two-dimensional electron gas (2DEG).

Therein, the step S14 is achieved by:

in the reaction chamber of the HWCVD system, under the first predetermined temperature and the predetermined pressure, with the first mixed gas, growing the n-type doped 4H-SiC barrier layer on the upper surface of the 3C-SiC potential well layer through two-dimensional step flow growth, and growing the Si face on the upper surface of the 4H-SiC barrier layer through epitaxial growth; and when a thickness of the 4H-SiC barrier layer reaches a third predetermined thickness value, cutting off supply of silane ($SiH_4$), propane ($C_3H_8$), and phosphine ($PH_3$) to the first mixed gas, so as to keep etching the upper surface of the 4H-SiC barrier using hydrogen ($H_2$).

Therein, the step S15 is achieved by:

in the reaction chamber of the HWCVD system, under the second predetermined temperature and the predetermined pressure, with the second mixed gas, growing the unintentionally doped 3C-SiC cap layer on the Si face of the 4H-SiC barrier layer through three-dimensional island growth; and when a thickness of the 3C-SiC cap layer reaches a fourth predetermined thickness value, cutting off supply of silane ($SiH_4$) and propane ($C_3H_8$) to the second mixed gas, so as to keep etching the upper surface of the 3C-SiC cap layer using hydrogen ($H_2$);

whereby the 3C-SiC cap layer and the Si face 4H-SiC barrier layer form the SiC heterojunction interface, thereby exciting the 2DHG.

Therein, the step S16 is achieved by:

using inductively coupled plasma (ICP) etching to create, at each of two opposite sides of a multi-layer SiC heterojunction, a respective gate trench for forming a longitudinally-conductive channel and a respective drain trench for enabling ohmic contact between a drain and a 2DEG laterally-conductive channel, wherein the multi-layer SiC heterojunction is composed of a SiC heterojunction formed by the 4H-SiC transition layer and the 3C-SiC potential well layer and a SiC heterojunction formed by the 4H-SiC barrier layer and the 3C-SiC cap layer;

using ion implantation to implant phosphorus (P) ions into the 3C-SiC cap layer below a source so as to form an $N^+$-doped region for modulating a threshold voltage (Vth) of the HEMT and to implant P ions into the multi-layer SiC heterojunction left to the drain so as to form $N^+$-doped regions for creating the ohmic contact between the 2DEG laterally-conductive channel and the drain;

using electron-beam evaporation to deposit alloy films in the $N^+$-doped regions, respectively, so as to form sources and drains for the ohmic contact;

using electron-beam evaporation to apply an insulating gate medium into the gate trench and to deposit a Schottky metal gate, wherein the insulating gate medium is one of $SiO_2$, $Al_2O_3$, $HfO_2$, and $La_2O_3$;

coating a protective layer outside the multi-layer SiC heterojunction; and coating a light shielding layer on the protective layer to prevent lateral light incidence and consequent impact on device performance.

Another embodiment of the present invention provides a method for preparing a SiC heterojunction normally-off HEMT, comprising the following steps:

high-electron-mobility transistor (HEMT), comprising steps of:

S21: selecting an unintentionally doped n-type 4H-SiC chip as a substrate;

S22: growing a 4H-SiC transition layer on an upper surface of the substrate through isomorphic epitaxial growth, and growing a C face on an upper surface of the 4H-SiC transition layer through epitaxial growth;

S23: growing a first potential well layer of unintentionally doped 3C-SiC on the C face of the 4H-SiC transition layer;

S24: growing a first barrier layer of n-type doped 4H-SiC on an upper surface of the 3C-SiC first potential well layer, and growing a C face on an upper surface of the 4H-SiC first barrier layer through epitaxial growth;

S25: growing a second potential well layer of unintentionally doped 3C-SiC on the C face of the 4H-SiC first barrier layer;

S26: growing a second barrier layer of n-type doped 4H-SiC on an upper surface of the 3C-SiC second potential well layer through epitaxial growth, and growing a Si face on an upper surface of the 4H-SiC second barrier layer through epitaxial growth;

S27: growing an unintentionally doped 3C-SiC cap layer on the Si face of the 4H-SiC second barrier layer; and S28: producing electrodes and protective films, so as to obtain a 3C-SiC/4H-SiC heterojunction normally-off double-channel high-electron-mobility transistor.

Still another embodiment of the present invention provides a SiC heterojunction normally-off single-channel HEMT prepared using the method for preparing a silicon carbide heterojunction normally-off high-electron-mobility transistor as described previously.

Yet another embodiment of the present invention provides a SiC heterojunction normally-off double-channel HEMT prepared using the method for preparing a silicon carbide heterojunction normally-off high-electron-mobility transistor as described previously.

By implementing the embodiments of the present invention, the following beneficial effect can be achieved:

As compared to traditional GaN-based heterojunction normally-off HEMTs, the disclosed SiC heterojunction single- and double-channel HEMTs are such prepared that two sides of the heterojunction interface have homogeneous elements (Si and C at the both sides), thereby eliminating diffusive contamination across the heterojunction interface, reducing process complexity, and improving device performance.

BRIEF DESCRIPTION OF THE DRAWINGS

In order to better illustrate technical features of embodiments of the present invention or of the prior art, brief introduction to accompanying drawings used to describe embodiments of the present invention or of the prior art are provided below. Apparently, the accompanying drawings listed below merely refer to some but not all embodiments of the present invention.

For those of ordinary skill in the art, more drawings can be derived from these drawings without paying creative efforts, and all these derived drawings will be part of the scope of the present invention.

DETAILED DESCRIPTION OF THE INVENTION

For further illustrating the means and functions by which the present invention achieves the certain objectives, the following description, in conjunction with the accompanying drawings and preferred embodiments, is set forth as below to illustrate the implement, structure, features and effects of the subject matter of the present invention.

Figure 1:
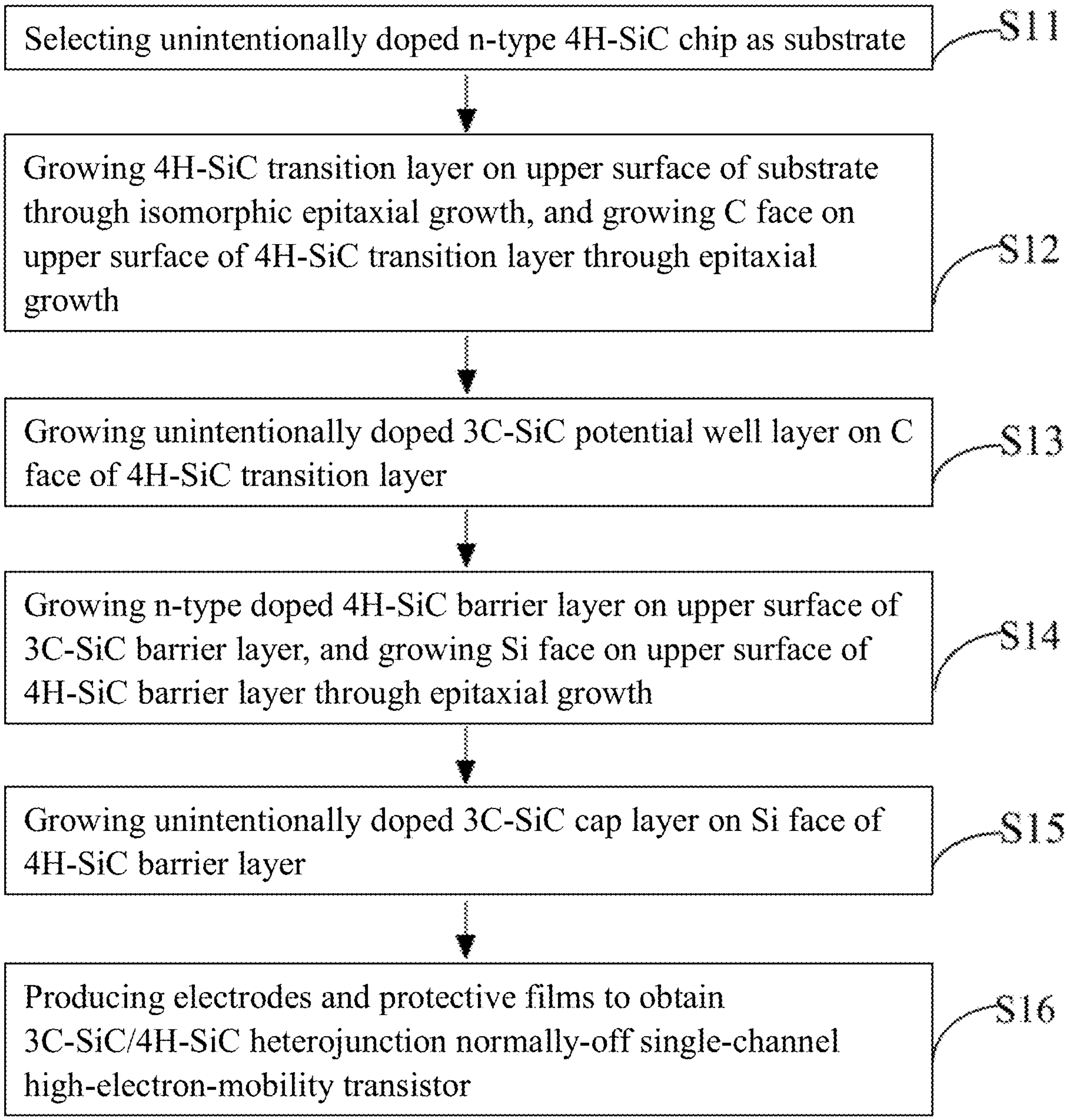
FIG. 1 is a flowchart of a method for preparing a SiC heterojunction normally-off single-channel HEMT according to Embodiment 1 of the present invention.

As shown in FIG. 1, in Embodiment 1 of the present invention, a method for preparing a silicon carbide (SiC) heterojunction normally-off single-channel high-electron-mobility transistor (HEMT) comprises the following steps.

At the step S11, an unintentionally doped n-type 4H-SiC chip is selected as a substrate.

Specifically, first, an unintentionally doped n-type 4H-SiC chip that is on-axis or is off-axis by a predetermined angle (e.g., ≤4°) is used as a substrate.

Secondary, at a first predetermined temperature (e.g., about 1850 K), hydrogen ($H_2$) is introduced into the reaction chamber of a hot wall chemical vapor deposition (HWCVD) system at a low flow to etch the growth face of the 4H-SiC chip substrate, so as to remove dangling bonds, surface scratches, and smears.

The step S12 involves growing a 4H-SiC transition layer on an upper surface of the substrate through isomorphic epitaxial growth, and growing a C face on an upper surface of the 4H-SiC transition layer through epitaxial growth.

Specifically, the substrate temperature for the etching stage is held, and the flow of the introduced $H_2$ is modulated. Also introduced are $SiH_4$ and $C_3H_8$ as reaction source gases and $PH_3$ as a doping gas, each at a proper flow. In this stage, the pressure inside the reaction chamber is held at 10 Pa. Then reflection high-energy electron diffraction (RHEED) is used to monitor the 4H-SiC growth face in situ for ensuring clearness of the resulting reconstructed pattern.

At this time, first, in the reaction chamber of the HWCVD system, under the first predetermined temperature (e.g., 1850 K) and the predetermined pressure (e.g., 10 Pa), with a first mixed gas formed by supplying silane ($SiH_4$), propane ($C_3H_8$), hydrogen ($H_2$), and phosphine ($PH_3$) as a doping gas, the 4H-SiC transition layer, which is isomorphous to the substrate on the growth face of the substrate, is formed through isomorphic epitaxial growth, and then the C face is formed by performing two-dimensional epitaxial growth on the surface of the 4H-SiC transition layer (e.g., by reasonably modulating the flows of and the flow ratio between the $SiH_4$ and $C_3Hg$ source gases, as well as the flow of the doping gas and the doping ratio $PH_3/SiH_4$, with the substrate temperature controlled precisely).

Secondary, the thickness of the 4H-SiC transition layer may be controlled by changing the growth rate, the growth time, and the RHEED pattern monitored in situ, and when the thickness of the C face 4H-SiC transition layer reaches the first predetermined thickness value (e.g., 2 um), supply of $SiH_4$, $C_3H_8$, and $PH_3$ to the first mixed gas is cut off and only $H_2$ remains delivered to the chamber to etch and remove dangling bonds, surface scratches, and smears from the growth face of the 4H-SiC transition layer, thereby reducing defects and contributing to interface smoothness.

The step S13 involves growing an unintentionally doped 3C-SiC potential well layer on the C face of the 4H-SiC transition layer.

Specifically, first, in the reaction chamber of the HWCVD system, at a second predetermined temperature (e.g., 1750 K), with a second mixed gas formed by supplying $SiH_4$, $C_3H_8$, and $H_2$, three-dimensional island growth is performed on the C face of the 4H-SiC transition layer to form an unintentionally doped 3C-SiC potential well layer. That is, when the temperature decreases to about 1750K, a mixed reaction source gas ($SiH_4$+$C_3H_8$+$H_2$) of a reasonable formula is introduced, and the flow of the Si source gas ($SiH_4$) is properly lowered while the flow of $C_3H_8$ is reasonably increased, with the pressure inside the reaction chamber (e.g., 10 Pa) held at the same level as that for the previous stage. Since the proportion of the Si source is lowered, the RHEED reconstructed pattern at the SiC growth face as monitored in situ transforms, making the growth mode at the surface of the 4H-SiC transition layer turn from two-dimensional step flow growth into three-dimensional island growth. At this time, the crystal form changes to 3C-SiC from 4H-SiC.

Secondary, the thickness of the 3C-SiC potential well layer may be controlled by changing the growth rate, the growth time, and the RHEED pattern monitored in situ, and when the thickness of the 3C-SiC potential well layer reaches the second predetermined thickness value (e.g., 25 nm), supply of $SiH_4$ and $C_3H_8$ to the second mixed gas is cut off and only $H_2$ remains delivered to the chamber to etch and remove dangling bonds, surface scratches, and smears from the growth face of the 3C-SiC potential well layer, thereby reducing defects and contributing to interface smoothness.

It is to be noted that the 3C-SiC potential well layer and the C face 4H-SiC transition layer form a SiC heterojunction interface, that excites the 2DEG.

The step S14 involves growing an n-type doped 4H-SiC barrier layer on an upper surface of the 3C-SiC potential well layer, and growing a Si face on an upper surface of the 4H-SiC barrier layer through epitaxial growth.

Specifically, in the reaction chamber of the HWCVD system, under the first predetermined temperature (e.g., 1850 K) and the predetermined pressure (e.g., 10 Pa), with the first mixed gas formed by supplying $SiH_4$, $C_3H_8$, $H_2$, and a proper proportion of $PH_3$, the n-type doped 4H-SiC barrier layer is formed on the upper surface of the 3C-SiC potential well layer through two-dimensional step flow growth, and then the Si face is formed by performing epitaxial growth on the upper surface of the 4H-SiC barrier layer. To be specific, the parameters used in this stage are restored to the level used in the step S12, including the substrate temperature, the total amount and the formula of the mixed reaction source gas ($SiH_4$+$C_3H_8$+$PH_3$+$H_2$), the pressure in the HWCVD reaction chamber, etc. At this time, the proportion of the Si source at the 4H-SiC growth face is larger than that used for 3C-SiC growth, and the RHEED pattern monitored in situ restores to the crystal form as seen in the growth of the 4H-SiC transition layer. The growth mode at the surface of the 4H-SiC barrier layer returns to two-dimensional step flow growth from three-dimensional island growth, and the film changes back to the 4H-SiC crystal form from the 3C-SiC crystal form.

Secondary, the thickness of the 4H-SiC barrier layer may be controlled by changing the growth rate, the growth time, and the RHEED pattern monitored in situ, and when the thickness of the Si face 4H-SiC barrier layer reaches the third predetermined thickness value (e.g., 25 nm), supply of $SiH_4$, $C_3H_8$, and $PH_3$ to the first mixed gas is cut off and only $H_2$ remains delivered to the chamber to etch and remove dangling bonds, surface scratches, and smears from the growth face of the 4H-SiC barrier layer, thereby reducing defects and contributing to interface smoothness.

It is to be noted that for minimizing any adverse effect of lowering the temperature to growth of the layers, in the temperature-changing process during Step 12→Step 13→Step 14, supply of $SiH_4$, $C_3H_8$, and $PH_3$ is cut off and only $H_2$ is used for etching the surfaces of the growth materials because the impact of etching is slower and weaker than that of temperature variation. This also prevents uneven among $SiH_4$, $C_3H_8$, $H_2$, and $PH_3$ of the first mixed gas introduced into the HWCVD reaction chamber in the initial stage.

The step S15 is about growing an unintentionally doped 3C-SiC cap layer at the upper surface of the 4H-SiC barrier layer.

Specifically, the process repeats the process of the Step 13. To be specific, the parameters used in this stage are restored to the level used in the step S13, including the substrate temperature, the total amount and the formula of the mixed reaction source gas ($SiH_4$+$C_3H_8$+$H_2$), the pressure in the HWCVD reaction chamber, the process for preparing the 3C-SiC potential well layer, etc.

First, in the HWCVD reaction chamber held at the second predetermined temperature (e.g., 1750K), with the second mixed gas formed by supplying $SiH_4$, $C_3H_8$, and $H_2$, three-dimensional island epitaxial growth is performed on the surface of the 4H-SiC transition layer to form the unintentionally doped 3C-SiC cap layer.

Secondary, the thickness of the 3C-SiC cap layer may be controlled by changing the growth rate, the growth time, and the RHEED pattern monitored in situ, and when the thickness of the 3C-SiC cap layer reaches the fourth predetermined thickness value (e.g., 25 nm), supply of $SiH_4$ and $C_3H_8$, to the second mixed gas is cut off and only $H_2$ remains delivered to the chamber to etch and remove dangling bonds, surface scratches, and smears from the growth face of the 3C-SiC cap layer, thereby reducing defects and contributing to interface smoothness.

It is to be noted that 3C-SiC cap layer and the Si face 4H-SiC barrier layer form a SiC heterojunction interface, thereby exciting the 2DHG.

The step S16 involves producing electrodes and protective films, so as to obtain a 3C-SiC/4H-SiC heterojunction normally-off single-channel HEMT.

Specifically, first, inductively coupled plasma (ICP) etching is used to create, at each of two opposite sides of the multi-layer SiC heterojunction, a respective gate (G) trench for forming a longitudinally-conductive channel and a respective drain (D) trench for enabling ohmic contact between a drain and a 2DEG laterally-conductive channel. Therein, the multi-layer SiC heterojunction has a SiC heterojunction formed by the 4H-SiC transition layer and the 3C-SiC potential well layer that excite the 2DEG and a SiC heterojunction formed by the 4H-SiC barrier layer and the 3C-SiC cap layer that excite the 2DHG.

Second, ion implantation is used to implant phosphorus (P) ions with a concentration of $N_m$ into the 3C-SiC cap layer below a source so as to form an $N^+$-doped region for modulating a threshold voltage ($V_{th}$) of the HEMT and to implant P ions into the multi-layer SiC heterojunction left to the drain so as to form $N^+$-doped regions for creating the ohmic contact between the 2DEG laterally-conductive channel and the drain.

As the third step, electron-beam evaporation is used to deposit alloy films in all of the $N^+$-doped regions, respectively, so as to form sources (S) and drains (D) for the ohmic contact.

As the fourth step, electron-beam evaporation is used to apply an insulating gate medium into the G trench and to deposit a Schottky metal gate (G), wherein the insulating gate medium is one of $SiO_2$, $Al_2O_3$, $HfO_2$, and $La_2O_3$.

As the fifth step, the multi-layer SiC heterojunction is coated with a protective layer.

As the sixth step, a light shielding layer is coated onto the protective layer to prevent lateral light incidence and consequent impact on device performance.

Corresponding to the method for preparing a SiC heterojunction normally-off HEMT in Embodiment 1 of the present invention, Embodiment 1 of the present invention further provides a SiC heterojunction normally-off single-channel HEMT prepared using the method for preparing a SiC heterojunction normally-off HEMT in Embodiment 1 of the present invention. The details of the method have been described previously and are not repeated herein. The specific structure is as depicted in the cross-sectional view shown in FIG. 2.

Figure 3:
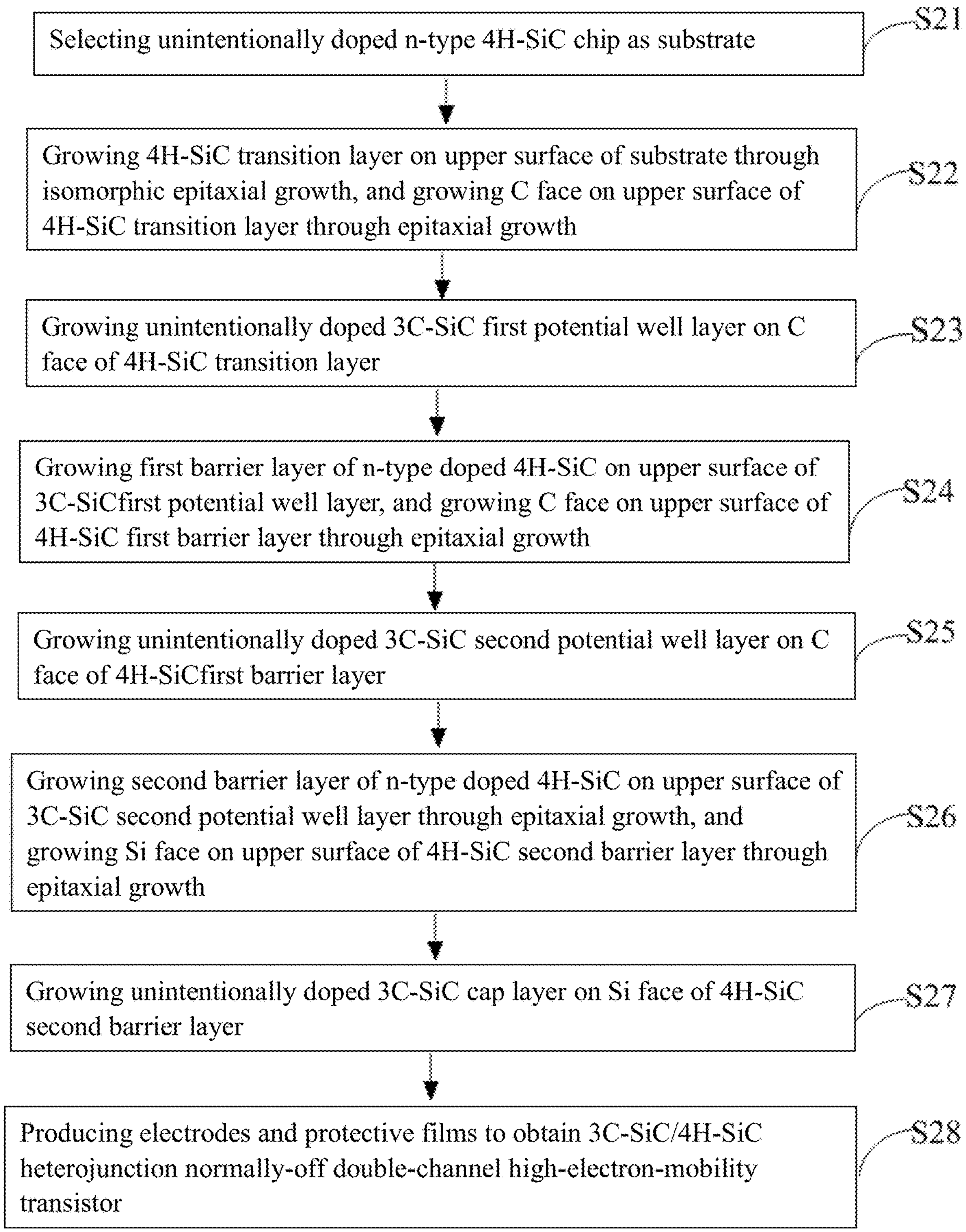
FIG. 3 is a flowchart of a method for preparing a SiC heterojunction normally-off double-channel HEMT according to Embodiment 2 of the present invention.

As shown in FIG. 3, according to Embodiment 2 of the present invention, a method for preparing a SiC heterojunction normally-off double-channel HEMT comprises the following steps.

the step S21, selecting an unintentionally doped n-type 4H-SiC chip as a substrate;

the step S22, growing a 4H-SiC transition layer on an upper surface of the substrate through isomorphic epitaxial growth, and growing a C face on an upper surface of the 4H-SiC transition layer through epitaxial growth;

the step S23, growing a first potential well layer of unintentionally doped 3C-SiC on the C face of the 4H-SiC transition layer;

the step S24, growing a first barrier layer of n-type doped 4H-SiC on an upper surface of the 3C-SiC first potential well layer, and growing a C face on the upper surface of the 4H-SiC first barrier layer through epitaxial growth;

the step S25, growing a second potential well layer of unintentionally doped 3C-SiC on the C face of the 4H-SiC first barrier layer;

the step S26, growing a second barrier layer of n-type doped 4H-SiC on an upper surface of the 3C-SiC second potential well layer through epitaxial growth, and growing a Si face on an upper surface of the 4H-SiC second barrier layer through epitaxial growth;

the step S27, growing an unintentionally doped 3C-SiC cap layer on the Si face of the 4H-SiC second barrier layer;

the step S28, producing electrodes and protective films, so as to obtain a 3C-SiC/4H-SiC heterojunction normally-off double-channel HEMT.

It is to be noted that the step S21 has a detailed process identical to that of the step S11 in Embodiment 1 of the present invention; the step S22 has a detailed process identical to that of the step S12 in Embodiment 1 of the present invention; the step S23 and the step S25 have detailed processes identical to that of the step S13 in Embodiment 1 of the present invention; the step S24 has a detailed process similar to that of the step S12 in Embodiment 1 of the present invention except that the 4H-SiC first barrier layer is thinner than the 4H-SiC transition layer; the step S26 has a detailed process identical to that of the step S14 in Embodiment 1 of the present invention; the step S27 has a detailed process identical to that of the step S15 in Embodiment 1 of the present invention; and the step S28 has a detailed process identical to that of the step S16 in Embodiment 1 of the present invention. The details can be seen in the method for preparing a SiC heterojunction normally-off single-channel HEMT in Embodiment 1 of the present invention and repeated description is omitted herein.

Corresponding to the method for preparing a SiC heterojunction normally-off double-channel HEMT in Embodiment 2 of the present invention, Embodiment 2 of the present invention further provides a SiC heterojunction normally-off double-channel HEMT prepared using the method for preparing a SiC heterojunction normally-off double-channel HEMT in Embodiment 2 of the present invention. The details of the method have been described previously and are not repeated herein. The specific structure is as depicted in the cross-sectional view shown in FIG. 4.

The parameters used for the SiC heterojunction normally-off double-channel HEMT of Embodiment 2 are shown in Table 1 below:

TABLE 1

| Material by Layer | Y-Direction Thickness (nm) | X-Direction Thickness (nm) |
|---|---|---|
| 3C—SiC Cap Layer | 15~35 | 4465 |
| Si Face 4H—SiC Barrier Layer | 15~35 | 4965 |
| 3C—SiC Potential Well Layer | 15~35 | 4965 |
| C Face 4H—SiC Barrier Layer | 15~35 | 4965 |
| C Face 4H—SiC Transition Layer | 2000 | 6000 |
| Oxide ($SiO_2$, $Al_2O_3$, $HfO_2$, $La_2O_3$) Layer | 75, 150 | 5~20 |
| 4H—SiC Substrate | 4000 | 6000 |
| Source Heavily-Doped ($N_m$) Layer | 25 | 500 |
| Drain Heavily-Doped ($N^+$) Layer | 75, 150 | 25 |
| Gate | 75, 150 | 500 |
| Source | 100 | 500 |
| Drain | 75, 150 | 500 |

The 3C-SiC/4H-SiC heterojunction normally-off single, double-channel HEMT of the embodiment of the present invention will be further described for explaining its structure and working principles.

Figure 2:
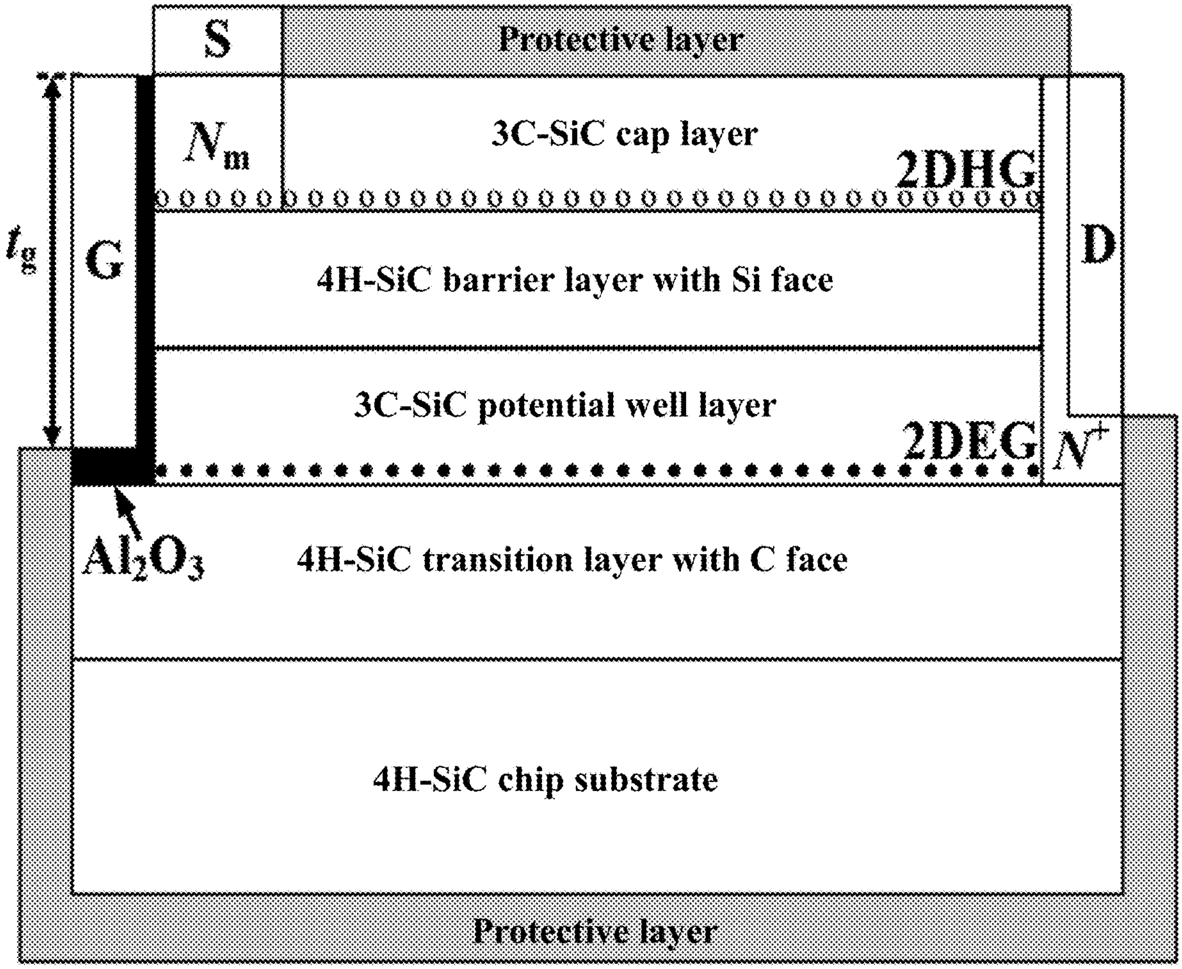
FIG. 2 schematically depicts the structure of the SiC heterojunction normally-off single-channel HEMT in Embodiment 1 of the present invention.
Figure 4:
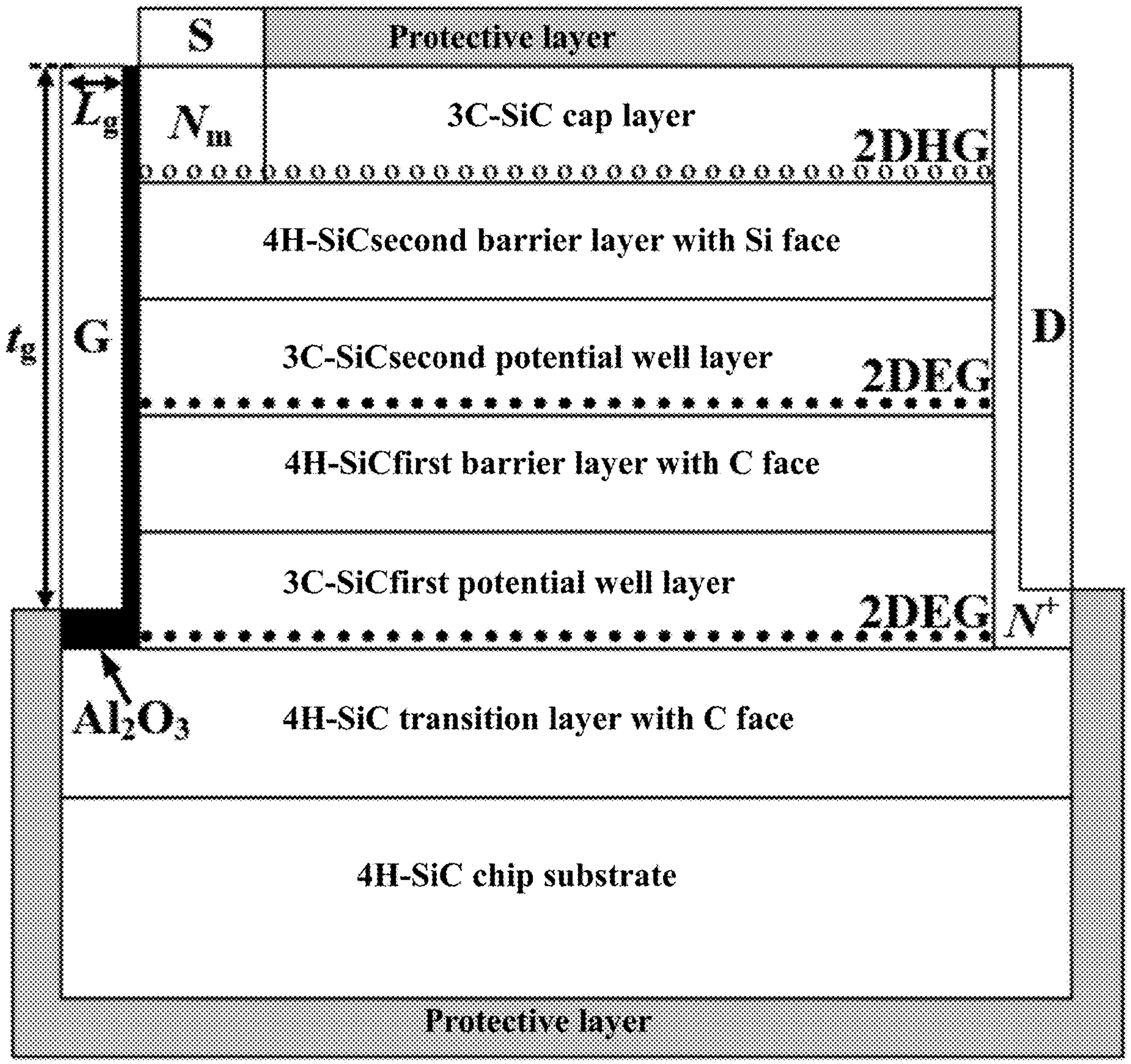
FIG. 4 schematically depicts the structure of the SiC heterojunction normally-off double-channel HEMT in Embodiment 2 of the present invention.

The present invention uses the spontaneous polarization effect of 4H-SiC to create two different SiC heterojunctions, namely 3C-SiC/4H-SiC (Si face) and 3C-SiC/4H-SiC (C face), as shown in FIG. 2 and FIG. 4. Therein, the heterojunction interface on the Si face excites a two-dimensional hole gas (2DHG) and the heterojunction interface on the C face excites a two-dimensional electron gas (2DEG). The 2DHG enables the HEMT to be normally off and the 2DEG forms a conductive channel that connects the source (S) and the drain (D).

In FIG. 2 and FIG. 4, when the left gate (G) of the device has a voltage ($V_g$) higher than the threshold voltage ($V_{th}$), interfacial negative charges are formed through control of the gate oxide (the insulating layer)/semiconductor (3C-SiC, 4H-SiC) heterojunction, and a conductive channel is built that passes through the interfacial charges, the SiC/4H-SiC (C face) heterojunction 2DEG lateral channel, and the drain (D) for the source (S). When $V_g<V_{th}$, the 2DHG at the 3C-SiC/4H-SiC (Si face) heterojunction depletes interfacial negative charges between the source and the SiC/4H-SiC (C face) heterojunction 2DEG channel, and cuts off the longitudinal conductive channel at the gate oxide/semiconductor heterojunction interface, thereby ensuring that the HEMT is normally off and works reliably. If $V_g$ increases gradually, due to the electric field force, the 2DHG at the oxide/semiconductor interface is displaced. Instead, negative charges (electrons) are attracted to this interface and accumulate here to a high concentration, thereby forming a longitudinally-conductive channel. When the drain-source voltage ($V_{th}$) is greater than 0, electrons injected from the source enter the 2DEG channel via the longitudinally-conductive channel, and then are attracted by the drain electric field to enter the drain, making the HEMT become on. In the blocking state where $V_g$<V, the 2DHG at the 3C/4H-SiC (Si face) heterojunction interface is drawn by the source. Due to electric neutrality, fixed negatively polarized charges appear at this interface. The 2DEG at the 3C/4H-SiC (C face) heterojunction interface is attracted by the drain. Due to electric neutrality, fixed positively polarized charges remain at this interface. A uniform electric field formed among these fixed, positively and negatively polarized charges effectively suppress electric field aggregation around the drain and the source caused by the drain-source voltage ($V_{ds}$), thereby improving lateral electric field distribution in the drift region between the drain and the source, increasing the average electric field strength in this region, and in turn increasing the breakdown voltage of the HEMT.

Additionally, the 2DHG at the 3C-SiC/4H-SiC (Si face) heterojunction interface can suppress the drain-induced barrier lowering effect caused by increase of the drain voltage. In a traditional HEMT, as the drain voltage increase, the barrier at the source decreases, so the number of electrons injected into the channel from the source increases significantly and the drain current increases consequently, leading to early breakdown of the HEMT. By contrast, in the disclosed HEMT, the 2DHG increases the conduction band barrier of the heterojunction below the source and prevents electrons from entering the channel from the source, thereby effectively suppressing the drain-induced barrier lowering effect and increasing the breakdown voltage of the device. Moreover, in the disclosed HEMT, the gate thickness has merely small impact on the drain-induced barrier lowering effect, and this allows the disclosed HEMT to be made compact in its lateral dimension.

Besides, the source acts as a floating field plate, which helps reduce the electric field peak at the edge of the gate, and further induce a new electric field peak at the right end of the source. Therefore, fixed positively and negatively polarized charges at 3C/4H-SiC (C face) and 3C/4H-SiC (Si face) interface and the source jointly enhance the lateral electric field of the disclosed HEMT, thereby increasing the breakdown voltage of the disclosed HEMT. Also, an $N^+$-type heavily-doped region is introduced below the source to lower the conduction band barrier at the heterojunction where the 2DHG is located, so as to modulate the 2DHG concentration and lower the threshold voltage ($V_{th}$) of the disclosed HEMT. The higher the doing concentration ($N_m$) in the $N^+$-type region is, the lower the concentration of the 2DHG below the source is, and the smaller $V_{th}$ the device has.

By changing the doping concentration $N_m$ in the heavily-doped region below the source, changing the gate oxide thickness, selecting different oxide materials, and changing the gate voltage, the energy-band structures of the oxide/semiconductor heterojunction of the disclosed single and double-channel HEMTs can be varied, and some related simulations are shown in FIGS. 5A, 5B, 5C and 5D.

FIGS. 5A, 5B, 5C and 5D provide energy-band structures at the oxide/semiconductor interface of a 3C/4H-SiC heterojunction normally-off single-channel HEMT when $V_g$=0V, $V_d$=1V, $t_b$=25 nm, and $t_c$=25 nm (x=511 nm, 0≤y≤100 nm), with CB and VB representing the conduction band and the valence band, respectively, wherein: (a) shows the band structure varying with the $N^+$-doped region concentration $N_m$; (b) shows the band structure varying with the thickness $L_g$ of $Al_2O_3$ below the gate; (c) shows the band structure varying with the oxide used below the gate; and (d) shows the conduction band structure varying with $V_g$ at the oxide/semiconductor interface of the double-channel HEMT.

Figure 5A:
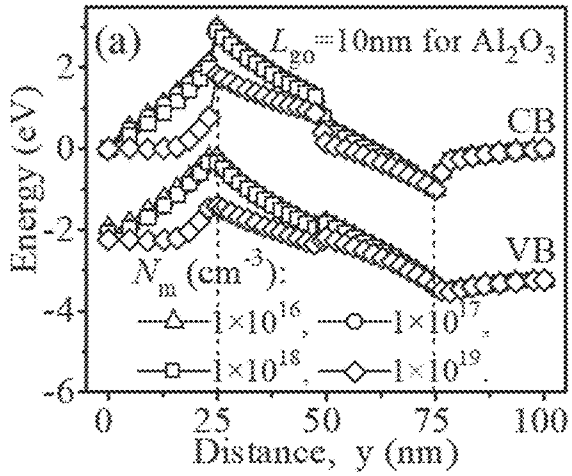
FIGS. 5A, 5B, 5C and 5D provide simulative energy-band structures with respect to the oxide/semiconductor heterojunction in the SiC heterojunction normally-off single-channel HEMT in Embodiment 1 of the present invention under different conditions.

According to FIGS. 5A, 5B, 5C and 5D, the 3C-SiC/4H-SiC (C face) heterojunction in the single-channel HEMT at $y_1$=50 nm and 3C-SiC/4H-SiC (C face) heterojunction of the double-channel HEMT at $y_1$=50 nm and $y_2$=75 nm each had a conduction band lower than the Fermi level $E_F$=0 eV, indicating the existence of electrons. Both of the single- and double-channel HEMTs had their valence bands at the 3C-SiC/4H-SiC (Si face) heterojunction $y_0$=25 nm higher than $E_F$, indicating the existence of holes. By only changing the doping concentration Nm, the resulting conduction band and valence band are as shown in FIG. 5A, wherein the gate oxide is $HfO_2$, and the thickness $L_g$=10 nm. When $N_m=1.0\times10^{16}$ $cm^{-3}$, the threshold voltage $V_{th}$=2.99 V. When $N_m=1.0\times10^{17}$ $cm^{-3}$, $V_{th}$=2.97 V. When $N_m=1.0\times10^{18}$ $cm^{-3}$, $V_{th}$=2.88 V. When $N_m=1.0\times10^{19}$ $cm^{-3}$, $V_{th}$=1.81 V. Since region is $N^+$-type dopped, the surface potential at the bottom of this region (y=25 nm) decreases. As a result, the energy band at the 3C/4H-SiC heterojunction interface near this region decreases as the doping concentration $N_m$ increases. Of course, for an energy band farther away from this region is less affected by doping, as shown in FIG. 5A.

Figure 5B:
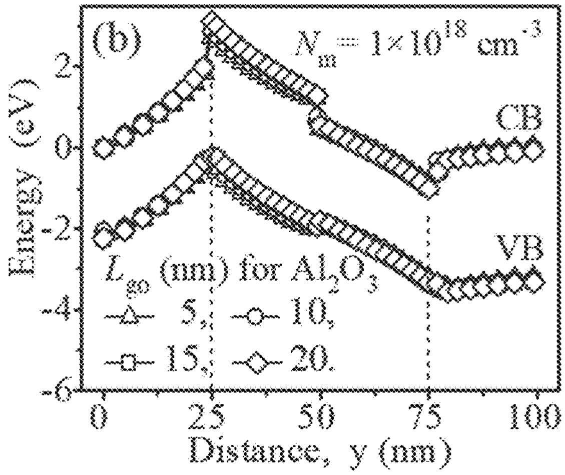

With only the thickness of the gate oxide changed, the resulting conduction band and valence band are shown in FIG. 5B, wherein the gate oxide is $HfO_2$ and $N_m=1.0\times10^{18}$ $cm^{-3}$. When $L_g$=5 nm, $V_{th}$=2.71 V. When $L_g$=10 nm, $V_{th}$=2.88 V. When $L_g$=15 nm, $V_{th}$=2.95 V. When $L_g$=20 nm, $V_{th}$=3.11 V. For the same oxide-based insulating layer, the thicker it is, the higher share of voltage it bears is, and in turn the higher $V_{th}$ required by modulation of the channel is.

Figure 5C:
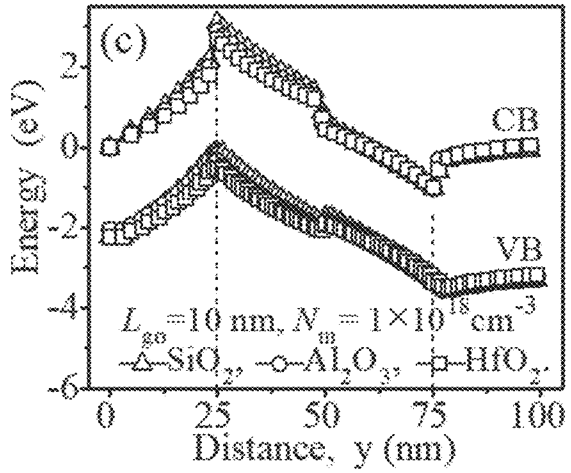
Figure 5D:
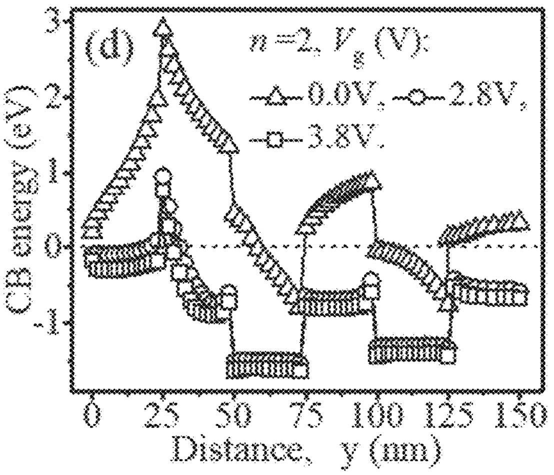

When different oxide insulating materials are used, the conduction band and the valence band vary as shown in FIG. 5C, wherein each oxide has a $L_g$=10 nm and $N_m=1.0\times10^{19}$ $cm^{-3}$. The relative dielectric constants of $SiO_2$, $Al_2O_3$, and $HfO_2$ are $\varepsilon_r$=3.9, 9.0, and 25.0, respectively. The use of a high-k (or high-F) medium helps improve the electric field at the oxide/semiconductor heterojunction [J. F. Du, et al., Electronics Letters, Vol. 51(2015): 104-106.]. Thus, the higher $\varepsilon_r$ is, the lower $V_{th}$ is. As shown in FIG. 5C, when the oxide used is $SiO_2$, $V_{th}$=3.09 V. When the oxide used is $Al_2O_3$, $V_{th}$=2.88 V. When the oxide used is $HfO_2$, $V_{th}$=2.69 V. In FIG. 5B, the higher the gate forward voltage $V_g$ is, the lower the conduction band energy at the oxide/semiconductor heterojunction is.

Figure 6A:
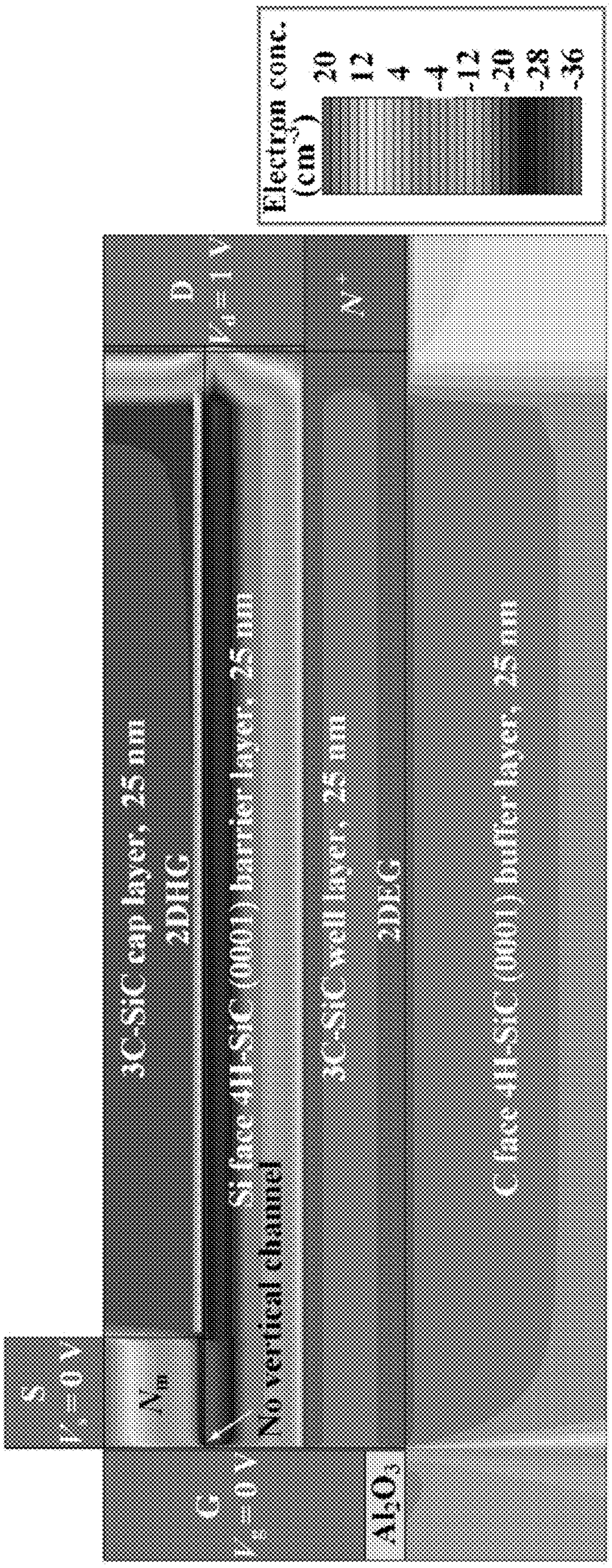
FIGS. 6A, 6B and 6C provide simulative electron-hole distribution with respect to the SiC heterojunction normally-off single- and double-channel HEMTs according to Embodiment 1 and Embodiment 2 of the present invention under different conditions.
Figure 6B:
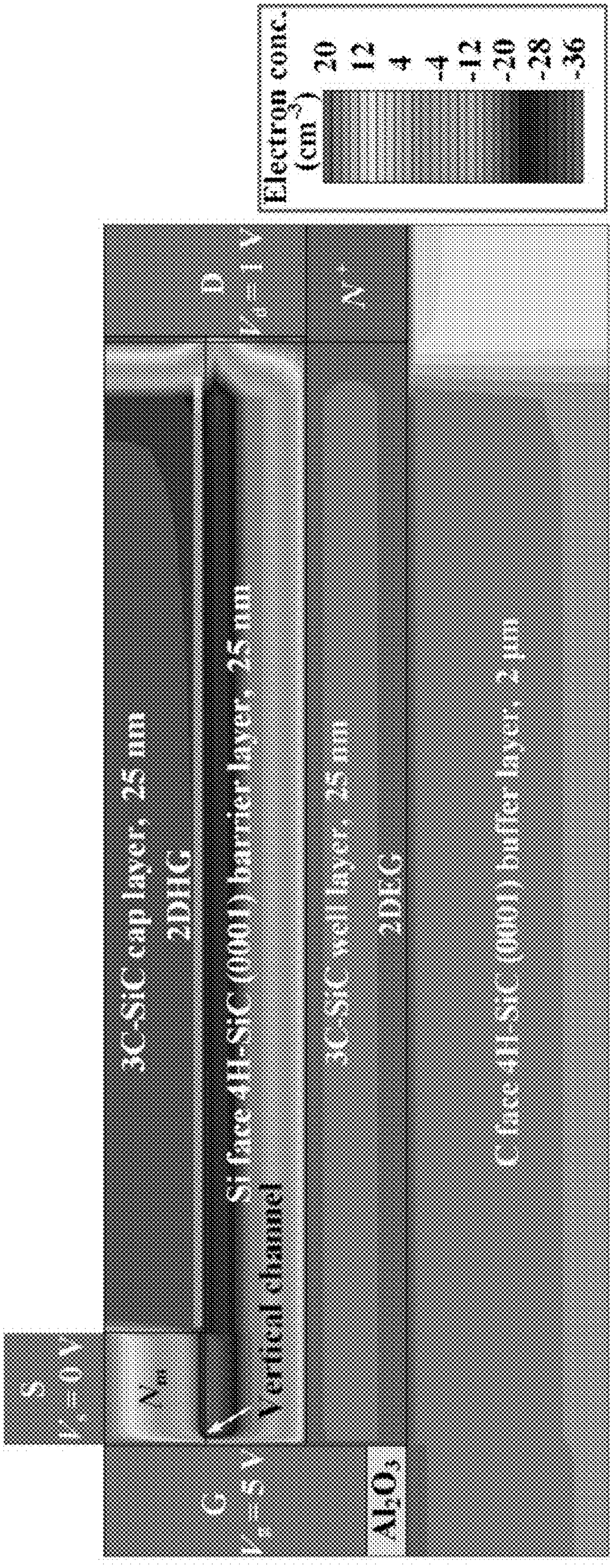
Figure 6C:
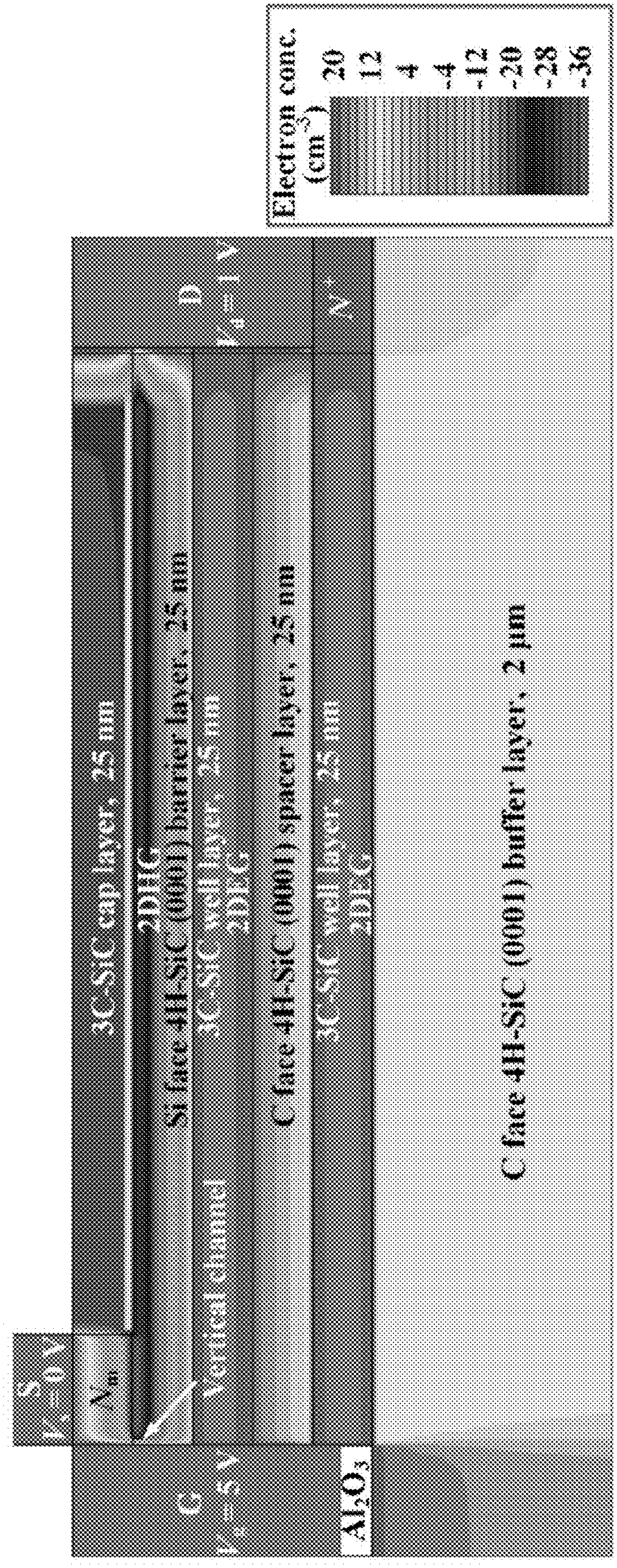

The electron-hole distributions in the 3C/4H-SiC heterojunction normally-off single- and double-channel HEMTs under different conditions are shown in FIGS. 6A, 6B and 6C. In FIG. 6A, when $V_g$=0V, there is no electrons at the oxide/semiconductor vertical interface in the single-channel HEMT, which means that there is not any vertical channel. In FIG. 6B, when $V_g$=5V, electrons exist at the oxide/semiconductor vertical interface in the single-channel HEMT, which means that there is a vertical channel. The legend at the right shows levels of the electron concentration in the device. In FIG. 6C, when $V_g$=5V, electrons exist at the oxide/semiconductor vertical interface of the double-channel HEMT, which means that there is a vertical channel. The legend at the right shows levels of the electron concentration in the device.

Figure 7A:
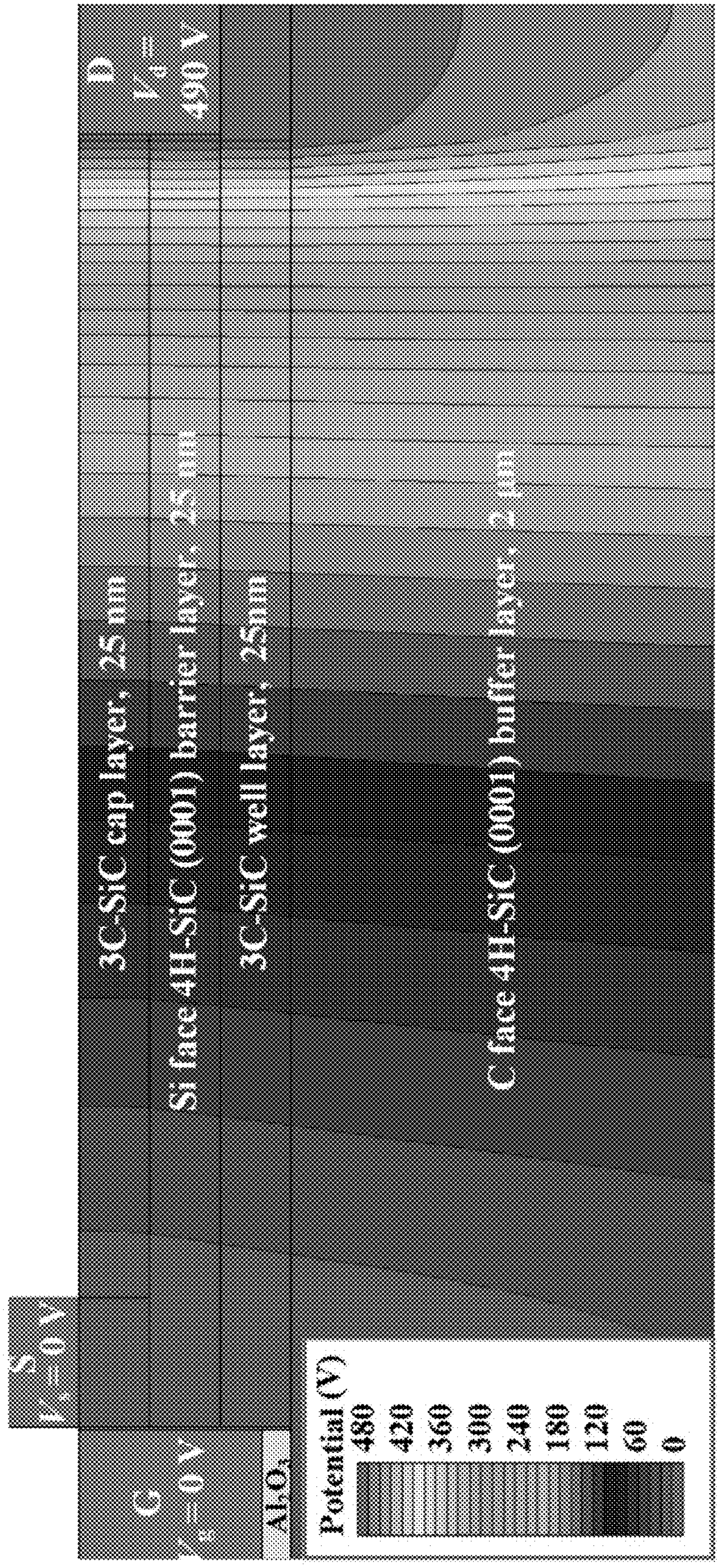
FIGS. 7A and 7B provide simulative equipotential line distribution with respect to the 3C-SiC/4H-SiC (C face) and 3C-SiC/4H-SiC (Si face) heterojunction interfaces of the SiC heterojunction normally-off single-channel HEMT in Embodiment 1 of the present invention under impact of fixed, positively and negatively polarized charges.
Figure 7B:
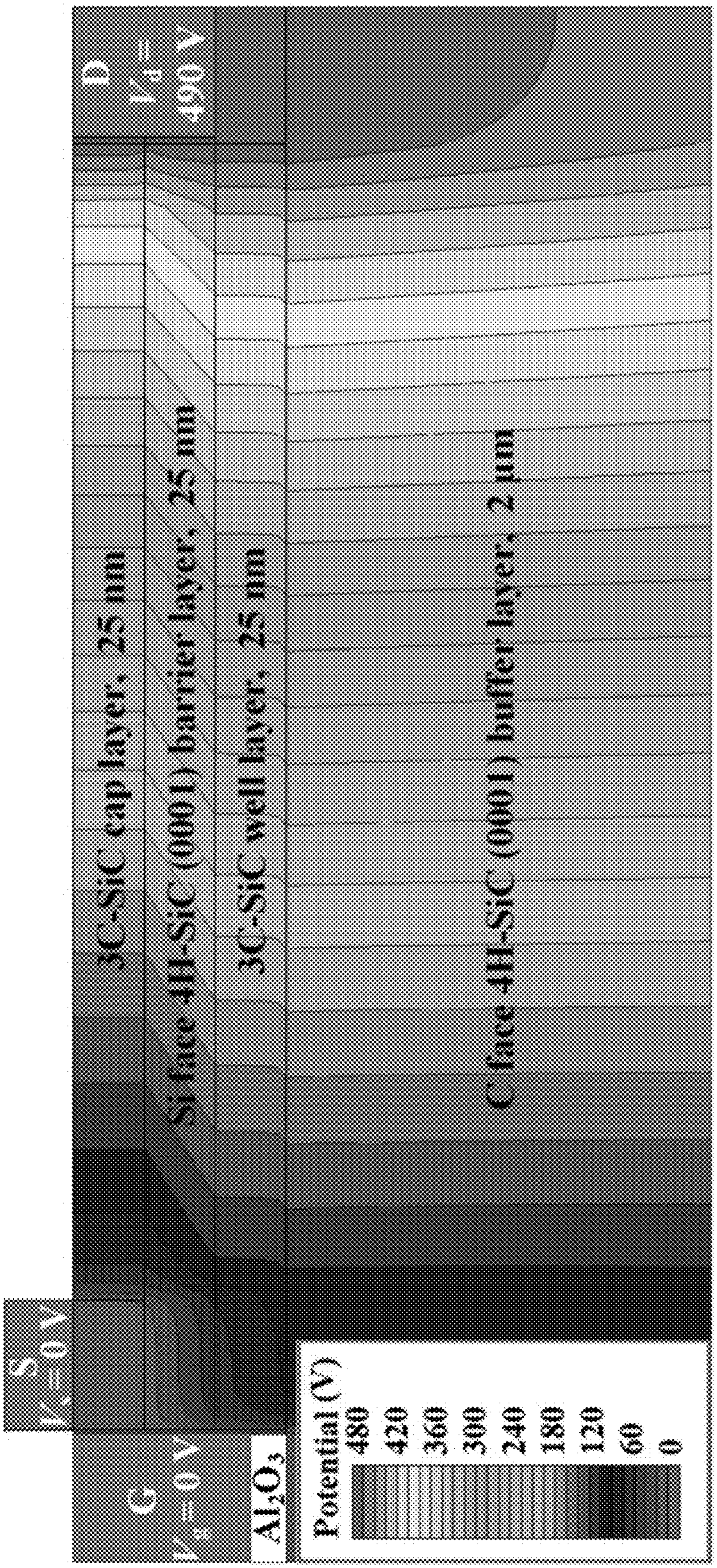

Fixed positively and negatively polarized charges at the 3C-SiC/4H-SiC (C face) heterojunction and the 3C-SiC/4H-SiC (Si face) heterojunction interface affect the SiC heterojunction normally-off single-channel HEMT in terms of potential distribution in a way shown in FIGS. 7A and 7B. Without considering this influence, the lateral distribution of equipotential lines becomes denser from the source to the drain, as shown in FIG. 7A, meaning that the strength of the electric field increase as the distance to the drain decreases, which increases the risk of breakdown and degrade voltage endurance. With the influence considered, the 2DEG at the 3C-SiC/4H-SiC (C face) heterojunction is attracted by the drain with fixed positively polarized charges are left here, and the 2DHG at the 3C-SiC/4H-SiC (Si face) heterojunction is transported to the source where the potential is low, with fixed negatively polarized charges left here. The fixed positively and negatively polarized charges generate an upward vertical electric field that overlaps the lateral electric field generated between the voltages of the source and the drain, making the overall electric field between the source and the drain become more uniform, with the distribution of equipotential lines much more even than that of the case where fixed positively and negatively polarized charges are not considered, as shown in FIG. 7B. Therefore, with the influence of fixed positively and negatively polarized charges considered, aggregation of the lateral electric field around the drain reduces significantly, thereby increasing the breakdown voltage ($V_B$) of the device.

Figure 8A:
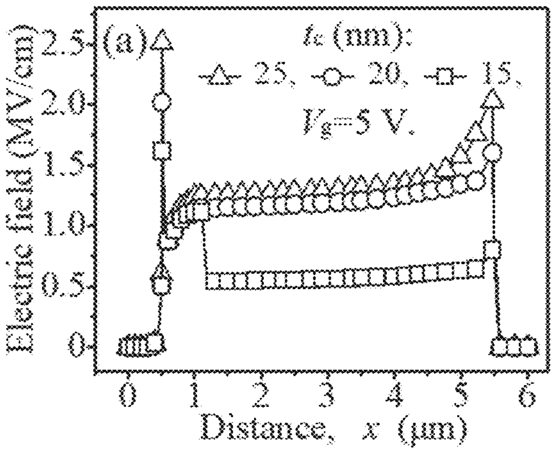
FIGS. 8A, 8B, 8C and 8D provide simulative performance of the SiC heterojunction normally-off single-channel HEMT in Embodiment 1 of the present invention under impact of changes in the thickness ($t_c$) of the 3C-SiC cap layer.
Figure 8B:
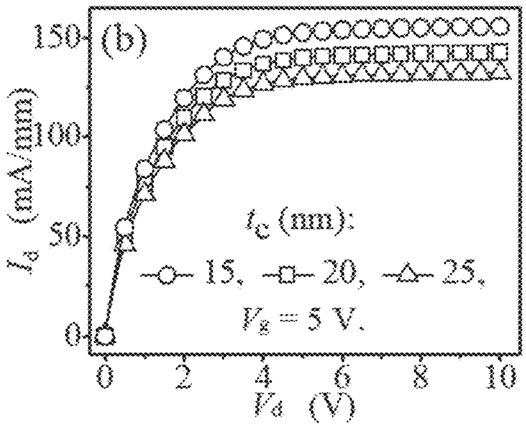
Figure 8C:
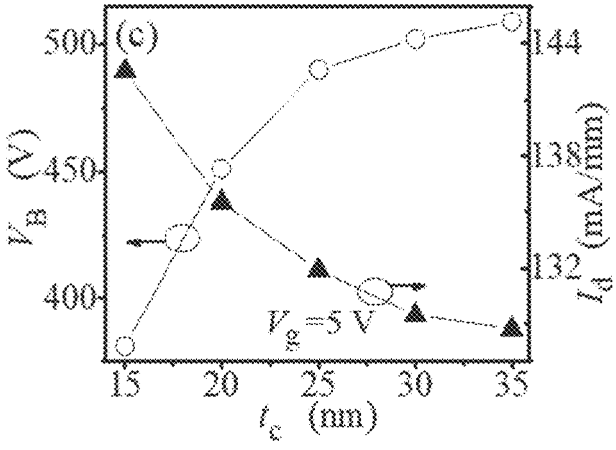
Figure 8D:
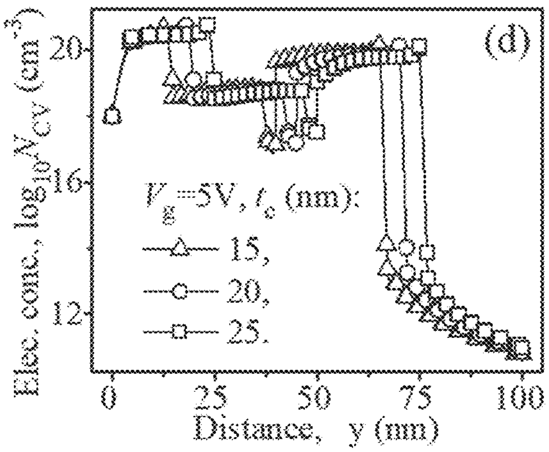

Variation of the thickness ($t_c$) of the 3C-SiC cap layer affects the SiC heterojunction normally-off single-channel HEMT in terms of performance in the way shown in FIGS. 8A, 8B, 8C and 8D. In FIGS. 8A, 8B, 8C and 8D, $V_g$5V, $t_b$=25 nm, $t_{go}$=10 nm, and $N_m=1.0\times10^{18}$ $cm^{-3}$. Increase of $t_c$ helps increase formation of 2DHG at the 3C-SiC/4H-SiC (Si face) heterojunction to saturation. When the 2DEG and the 2DHG at the 3C-SiC/4H-SiC (C face) heterojunction and the 3C-SiC/4H-SiC (Si face) heterojunction interface are depleted, due to electric neutrality, more fixed positively and negatively polarized charges remain, and this helps enhance the electric field between the 3C-SiC/4H-SiC (C face) heterojunction and the 3C-SiC/4H-SiC (Si face) heterojunction, as shown in FIG. 8A. Consequently, the depletion region between the gate and the drain expands and the breakdown voltage of the HEMT increases to its saturation. However, increase of the 2DHG concentration helps increase depletion of the 2DEG at the 3C-SiC/4H-SiC (C face) heterojunction interface, leading to decrease of the 2DEG concentration, as shown in FIG. 8D. This in turn makes drain current ($I_d$) decrease, as shown in FIGS. 8B and 8C.

Figure 9A:
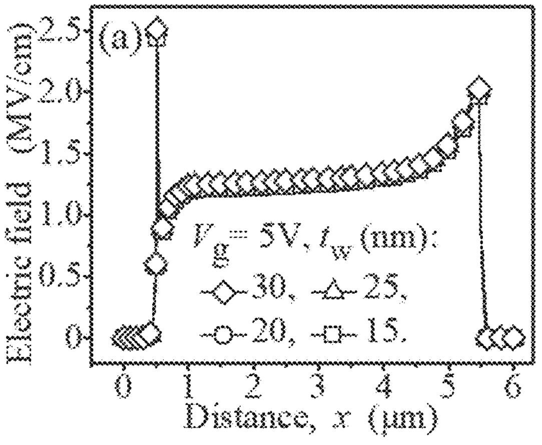
FIGS. 9A, 9B, 9C and 9D provide simulative performance of the SiC heterojunction normally-off single-channel HEMT in Embodiment 1 of the present invention under impact of changes in the thickness ($t_w$) of the 3C-SiC potential well layer.
Figure 9B:
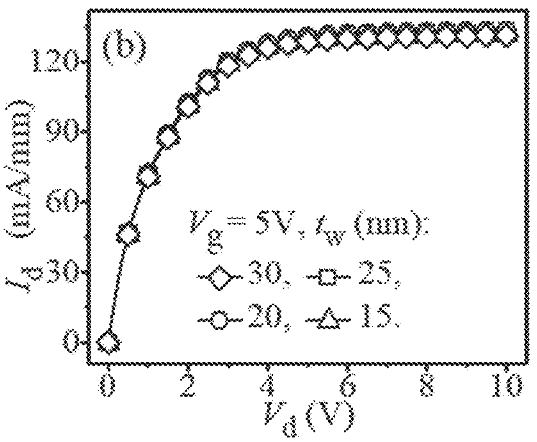
Figure 9C:
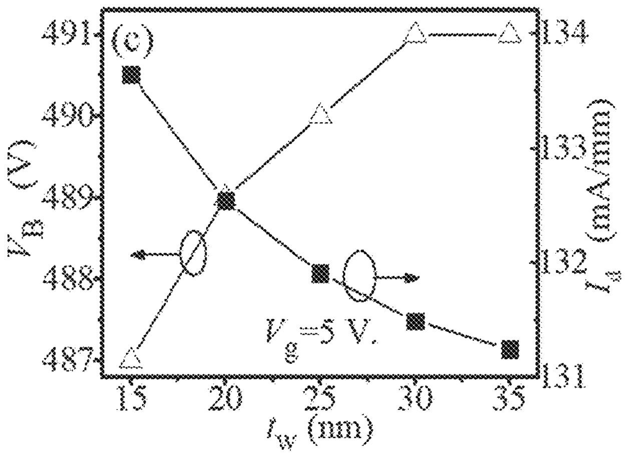
Figure 9D:
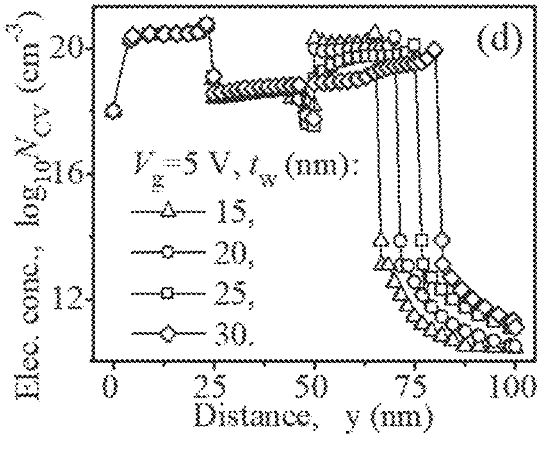

Variation of the thickness ($t_w$) of the 3C-SiC potential well layer affects the SiC heterojunction normally-off single-channel HEMT in terms of performance in the way shown in FIGS. 9A, 9B, 9C and 9D. In FIGS. 9A, 9B, 9C and 9D, $V_g$=5V, $t_b$=25 nm, $t_c$=25 nm, $t_{go}$=10 nm, and $N_m=1.0\times10^{18}$ $cm^{-3}$. As $t_w$ increases, formation of 2DHG at the 3C-SiC/4H-SiC (Si face) heterojunction increases gradually to saturation. When the 2DEG at eh 3C-SiC/4H-SiC (C face) heterojunction interface is depleted, due to electric neutrality, more fixed positively polarized charges remain, and this helps enhance the electric field between the 3C-SiC/4H-SiC (C face) heterojunction and the 3C-SiC/4H-SiC (Si face) heterojunction, as shown in FIG. 9A. Consequently, the depletion region between the gate and the drain expands and the breakdown voltage of the HEMT increases to its saturation, as shown in FIG. 9C. However, increase of the 2DHG concentration helps increase depletion of the 2DEG at the 3C-SiC/4H-SiC (C face) heterojunction interface, leading to decrease of the 2DEG concentration, as shown in FIG. 9D. This in turn makes the drain current ($I_d$) decrease, as shown in FIGS. 9B and 9C.

Figure 10A:
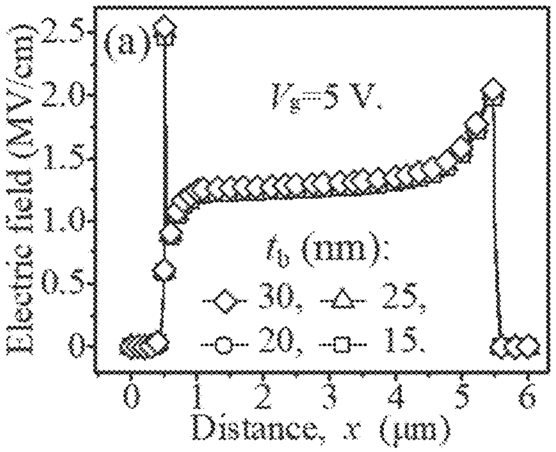
FIGS. 10A, 10B, 10C and 10D provide simulative performance of the SiC heterojunction normally-off single-channel HEMT in Embodiment 1 of the present invention under impact of changes in the thickness ($t_b$) of the 4H-SiC barrier layer.
Figure 10B:
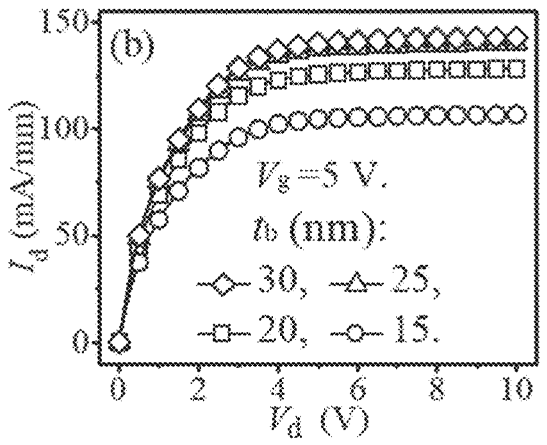
Figure 10C:
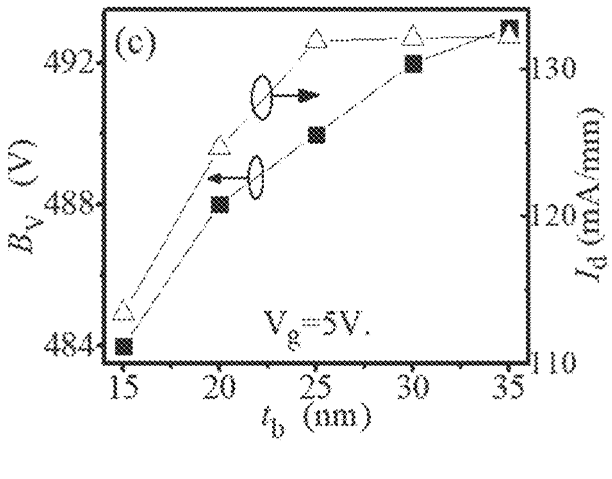
Figure 10D:
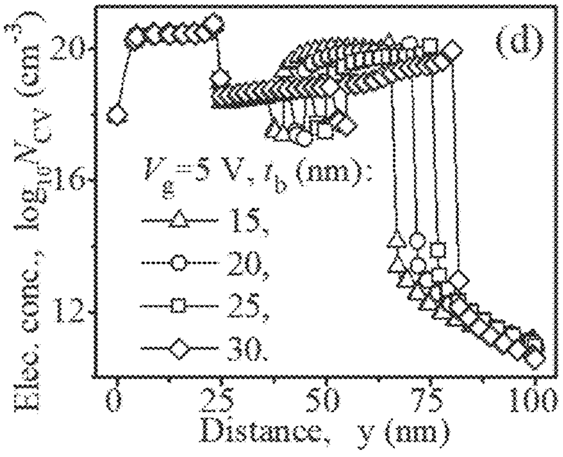

Variation of the thickness ($t_b$) of the 4H-SiC barrier layer affects the SiC heterojunction normally-off single-channel HEMT in terms of performance in a way shown in FIGS. 10A, 10B, 10C and 10D. In FIGS. 10A, 10B, 10C and 10D, $V_g$=5V, $t_c$=25 nm, $t_{go}$=10 nm, and $N_m$=1.0×10$^{18}$ cm$^{-3}$. As $t_b$ increases, the spontaneous polarization effect of 4H-SiC increases to its saturation. The concentration of the 2DHG at the 3C-SiC/4H-SiC (Si face) heterojunction interface increases slightly to its saturation, so as to facilitate depletion in the drift region between the gate and the drain. Meanwhile, increase of $t_b$ has the same effect as increase of the distance between positively and negatively fixed polarized charges corresponding to the 3C-SiC/4H-SiC (C face) heterojunction and the 3C-SiC/4H-SiC (Si face) heterojunction interface, respectively, and leads to a weakened electric field therein. Thus, the electric field in the drift region between the gate and the drain can basically remain constant, as shown in FIG. 10A. As can be seen, the breakdown voltage of the HEMT slightly increases and gradually approaches to its saturation. Meanwhile, increase of the 2DHG concentration helps increase depletion of the 2DEG at the 3C-SiC/4H-SiC (C face) heterojunction interface, leading to decrease of the 2DEG concentration, as shown in FIG. 10D. This in turn makes the drain current decrease, as shown in FIGS. 10B and 10C.

Figure 11A:
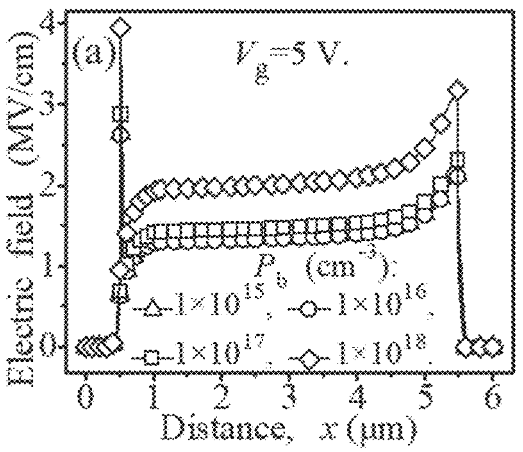
FIGS. 11A, 11B, 11C and 11D provide simulative performance of the SiC heterojunction normally-off single-channel HEMT in Embodiment 1 of the present invention under impact of changes in the doping concentration ($P_b$) in the 4H-SiC barrier layer.
Figure 11B:
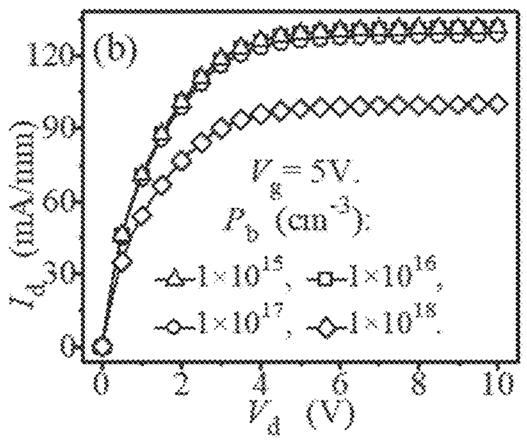
Figure 11C:
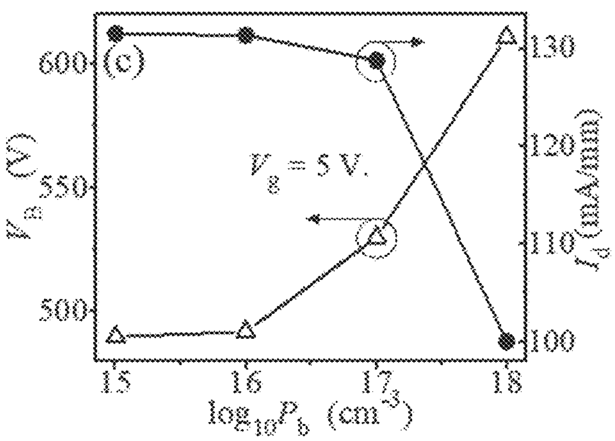
Figure 11D:
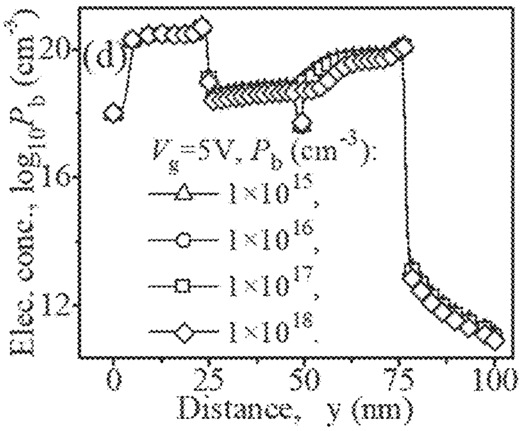

Variation of the P-type doping concentration ($P_b$) in the barrier layer 4H-SiC affects the SiC heterojunction normally-off single-channel HEMT in terms of performance in a way as shown in FIGS. 11A, 11B, 11C and 11D. Increase of $P_b$ helps enhance spontaneous polarization of 4H-SiC (Si face), leading to an increased 2DHG concentration at the 3C-SiC/4H-SiC (Si face) heterojunction interface. This in turn increases depletion of charger carriers in the vertical conductive channels around two ends of the 2DHG channel. Meanwhile, when $P_b$ increases, due to electric neutrality, more fixed positively and negatively polarized charges remain at the 3C-SiC/4H-SiC (C face) and 3C-SiC/4H-SiC (Si face) heterojunction interfaces, thereby facilitating enhancement of the electric field between the two heterojunction interfaces, as shown in FIG. 11A. This helps increase the breakdown voltage of the HEMT, as shown in FIG. 11C. Meanwhile, when the device is on, as $P_b$ increases, the concentration of electrons in the section of the vertical channels corresponding to the 4H-SiC barrier layer (25 nm<y<50 nm) decreases. This eventually leads to decrease of the drain current, as shown in FIGS. 11B and 11D.

Figure 12A:
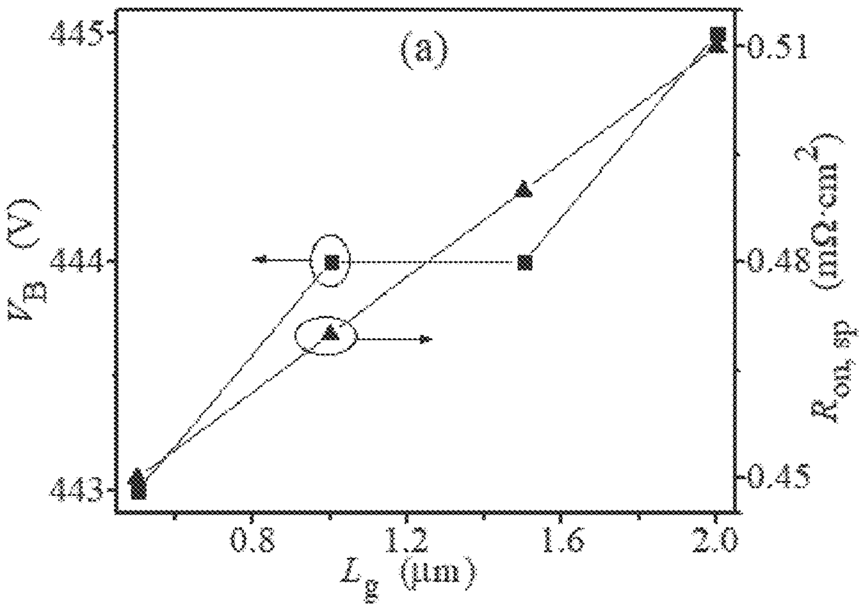
FIGS. 12A and 12B provide simulative breakdown voltage and specific on resistance of the SiC heterojunction normally-off double-channel HEMT in Embodiment 2 of the present invention under impact of changes in the gate thickness ($L_g$) and the height ($t_g$) of the HEMT.
Figure 12B:
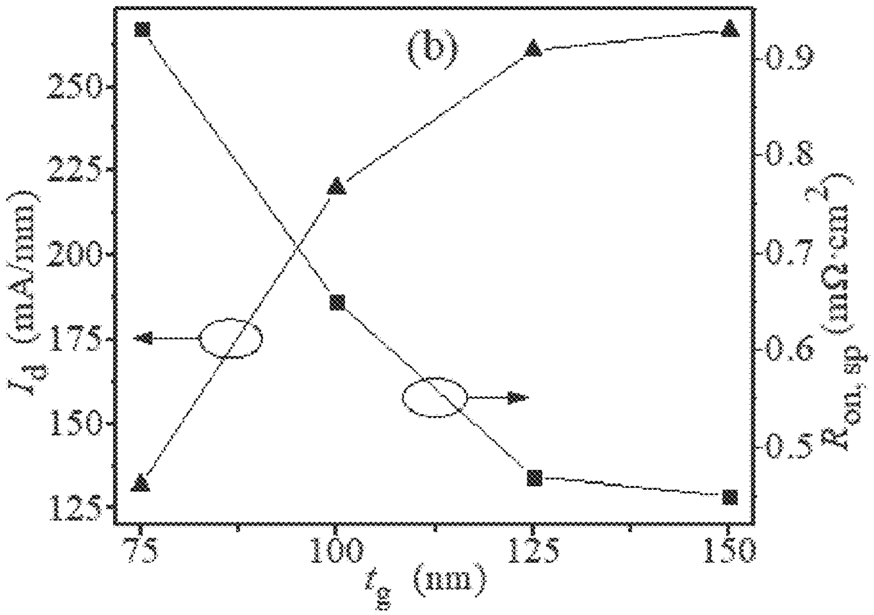
Figure 13A:
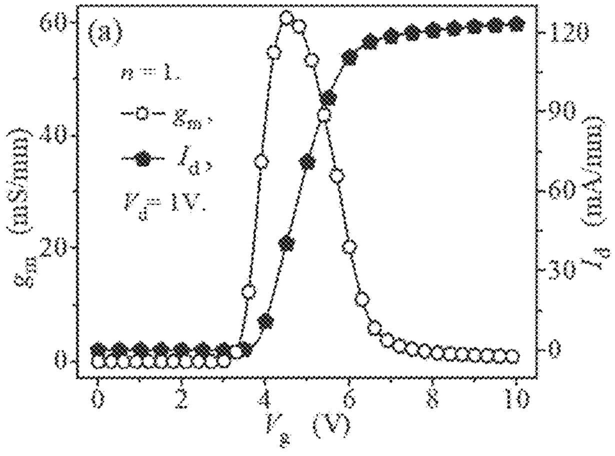
FIGS. 13A, 13B, 13C and 13D provide simulative-transfer and output-characteristic curves with respect to the SiC heterojunction normally-off single- and double-channel HEMTs according to Embodiment 1 and Embodiment 2 of the present invention.
Figure 13B:
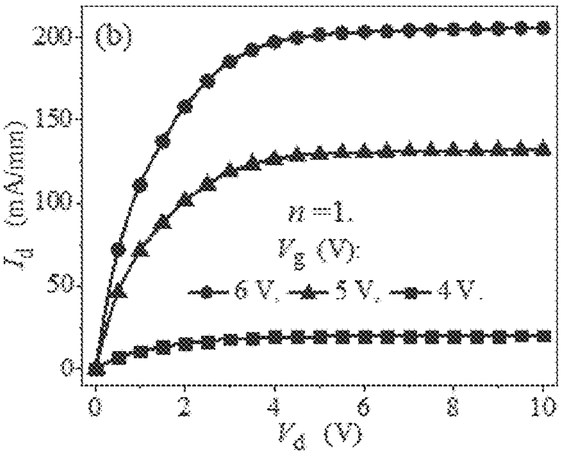
Figure 13C:
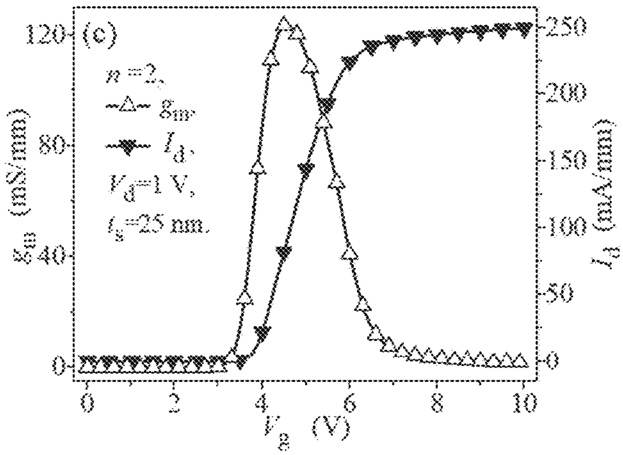
Figure 13D:
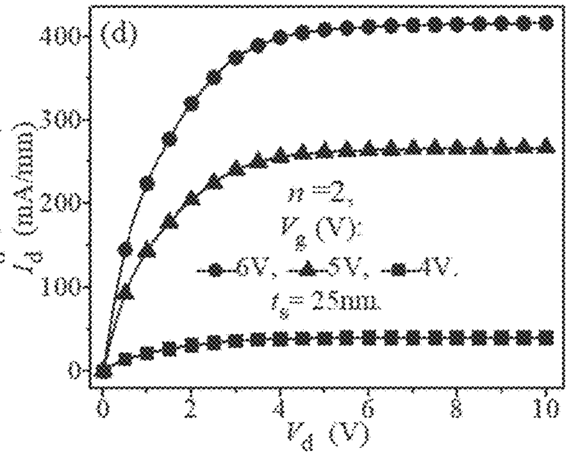

The gate thickness $L_g$ and the height $t_g$ affect the breakdown voltage ($V_B$) and the specific on resistance ($R_{on,\ sp}$) of the SiC heterojunction normally-off double-channel HEMT in a way shown in FIGS. 12A and 12B. As shown, $R_{on,\ sp}$ slightly increases as $L_g$ increases because the length of the longitudinally-conductive channel is independent of variation of $L_g$. In addition, in the double-channel HEMT, the drain-induced barrier lowering effect is suppressed, making $V_B$ of the HEMT less able to vary with $L_g$, as shown in FIG. 12A. If $t_g$ is too small to allow the gate to fully cover two heterojunctions, it is impossible to have two effective conductive channels, so $I_d$ is relatively low and $R_{on,\ sp}$ is relatively high. If $t_g$ increases to the extent that the gate is long enough to fully cover two heterojunctions to form two effective conductive channels, $I_d$ increases until it becomes saturated and $R_{on,\ sp}$ decreases until it becomes steady, as shown in FIG. 12B.

The characteristics of the disclosed single- and double-channel HEMTs in terms of transfer and output are shown in FIGS. 13A, 13B, 13C and 13D. Therein, the admittance ($g_m$) may be obtained by differentiating $V_g$ using $I_d$. As the forward $V_g$ increases to be higher than $V_{th}$, more and more electrons are attracted to and accumulate in the vertical channel at the oxide/semiconductor heterojunction. Consequently, the HEMT starts to work normally. When $V_g$ reaches a predetermined value, sine the vertical channel at the lateral wall of the trench gate has been saturated by the electrons accumulating therein, the $I_d$ value of the HEMT basically remains constant, as shown in FIGS. 13A, 13B, 13C and 13D. As $V_d$ increases gradually, charger carriers shift faster in the channel, so the drain current ($I_d$) increases rapidly. When $V_d$ increases to a certain extent, the velocity of charger carriers shifting in the 2DEG channel reaches its saturation, and $I_d$ becomes steady gradually instead of increasing with $V_d$. By comparing (a) and (c) as well as (b) and (d) in FIGS. 13A, 13B, 13C and 13D, it is clear that, under the same working conditions, $g_m$ and $I_d$ of the double-channel device are about equal to two times of those of the single-channel device. This is because the double-channel device has two conductive channels, and the total 2DEG concentration is approximately equal to two times of that of a single-channel device.

The disclosed HEMT is small in specific on resistance ($R_{on,\ sp}$) and high in breakdown voltage ($V_B$). In the disclosed HEMT, since the source and the drain are at the same side with respect to the gate, the lateral size of the device can be reduced effectively. Meanwhile, the disclosed HEMT uses 3C-SiC to form the potential well layer, wherein the 2DEG is more mobile than 4H-SiC. Particularly, the disclosed SiC heterojunction double-channel HEMT has a $R_{on,\ sp}$ smaller than those reported in literature [Zhou Q, et al., IEEE Trans Electron Devices, Vol. 60 (2013): 1075-1081; Xiong J Y, et al., Science China Information Sciences, Vol. 59 (2016): 042410; Yang C, et al., Superlattice & Microstructures, Vol. 92 (2016): 92-99; Yang C, et al., Science China Information Sciences, Vol. 61 (2018): 062402]. On the other hand, it is right because the disclosed HEMT uses 3C-SiC and 4H-SiC having bandgaps much larger than that of Si, it has very high voltage endurance. For a power device at a given voltage level, the smaller $R_{on,\ sp}$ of the device is, the greater the power figure of merit (FOM) value is. The disclosed single, double-channel HEMTs have FOM values of 2.58 MW/mm$^2$ and 4.36 MW/mm$^2$, respectively, representing good balance between $V_B$ and $R_{on,\ sp}$.

To sum up, the disclosed SiC heterojunction HEMT is a normally-off device with a relatively high breakdown voltage and a relatively low threshold voltage ($V_{th}$). Its specific on resistance is very small and reliability is high. In addition, the device can be made compact in the lateral dimension making it contributive to enhanced integration and design freedom of power ICs. Different crystals in the SiC heterojunction are basically alike in terms of lattice constant and thermal conductivity, and the piezoelectric polarization effect at the heterojunction interface is ignorable, so the modulation parameters can be simplified. Meanwhile, since the crystals forming SiC have similar chemical properties, diffusive contamination among chemical components during preparation of the device can be eliminated, thereby ensuring stable performance.

By implementing the embodiments of the present invention, the following beneficial effect can be achieved:

As compared to traditional GaN-based heterojunction normally-off HEMTs, the disclosed SiC heterojunction single- and double-channel HEMTs are such prepared that two sides of the heterojunction interface have homogeneous elements (Si and C at the both sides), thereby eliminating diffusive contamination across the heterojunction interface, reducing process complexity, and improving device performance.

The present invention has been described with reference to the preferred embodiments and it is understood that the embodiments are not intended to limit the scope of the present invention. Moreover, as the contents disclosed herein should be readily understood and can be implemented by a person skilled in the art, all equivalent changes or modifications which do not depart from the concept of the present invention should be encompassed by the appended claims.

What is claimed is:

1. A method for preparing a silicon carbide (SiC) heterojunction normally-off high-electron-mobility transistor (HEMT), comprising steps of:

S11. selecting an unintentionally doped n-type 4H-SiC chip as a substrate;

S12. growing a 4H-SiC transition layer on an upper surface of the substrate through isomorphic epitaxial growth, and growing a C face on an upper surface of the 4H-SiC transition layer through epitaxial growth;

S13. growing an unintentionally doped 3C-SiC potential well layer on the C face of the 4H-SiC transition layer;

S14. growing an n-type doped 4H-SiC barrier layer on an upper surface of the 3C-SiC potential well layer, and growing a Si face on an upper surface of the 4H-SiC barrier layer through epitaxial growth;

S15. growing an unintentionally doped 3C-SiC cap layer on the Si face of the 4H-SiC barrier layer; and S16. producing electrodes and protective films, so as to obtain a 3C-SiC/4H-SiC heterojunction normally-off single-channel high-electron-mobility transistor.

2. The method of claim 1, wherein the step S11 is achieved by:

taking the unintentionally doped n-type 4H-SiC chip, which is on-axis or is off-axis by a predetermined angle, as the substrate, and etching a growth face of the 4H-SiC chip using hydrogen under a first predetermined temperature and a predetermined pressure in a reaction chamber of a hot-wall chemical vapor deposition (HWCVD) system, so as to remove dangling bonds, surface scratches, and smears.

3. The method of claim 2, wherein the step S12 is achieved by:

in the reaction chamber of the HWCVD system, under the first predetermined temperature and the predetermined pressure, with a first mixed gas formed by supplying silane ($SiH_4$), propane ($C_3H_8$), hydrogen ($H_2$), and phosphine ($PH_3$) as a doping gas, growing the 4H-SiC transition layer, which is isomorphous to the substrate on the etched growth face of the substrate, through isomorphic epitaxial growth, and growing the C face on the upper surface of the 4H-SiC transition layer through two-dimensional epitaxial growth; and when a thickness of the 4H-SiC transition layer reaches a first predetermined thickness value, cutting off supply of silane ($SiH_4$), propane ($C_3H_8$), and phosphine ($PH_3$) as the doping gas to the first mixed gas, so as to keep etching the upper surface of the 4H-SiC transition using hydrogen ($H_2$).

4. The method of claim 3, wherein the step S13 is achieved by:

in the reaction chamber of the HWCVD system, under a second predetermined temperature and the predetermined pressure, with a second mixed gas formed by supplying silane ($SiH_4$), propane ($C_3H_8$), and hydrogen ($H_2$), growing the unintentionally doped 3C-SiC potential well layer on the C face of the 4H-SiC transition layer through three-dimensional island growth; and when a thickness of the 3C-SiC potential well layer reaches a second predetermined thickness value, cutting off supply of silane ($SiH_4$) and propane ($C_3H_8$) to the second mixed gas, so as to keep etching the upper surface of the 3C-SiC potential well layer using hydrogen ($H_2$);

whereby the 3C-SiC potential well layer and the C face 4H-SiC transition layer form a SiC heterojunction interface, thereby exciting a two-dimensional electron gas (2DEG).

5. The method of claim 4, wherein the step S14 is achieved by:

in the reaction chamber of the HWCVD system, under the first predetermined temperature and the predetermined pressure, with the first mixed gas, growing the n-type doped 4H-SiC barrier layer on the upper surface of the 3C-SiC potential well layer through two-dimensional step flow growth, and growing the Si face on the upper surface of the 4H-SiC barrier layer through epitaxial growth; and when a thickness of the 4H-SiC barrier layer reaches a third predetermined thickness value, cutting off supply of silane ($SiH_4$), propane ($C_3H_8$), and phosphine ($PH_3$) to the first mixed gas, so as to keep etching the upper surface of the 4H-SiC barrier using hydrogen ($H_2$).

6. The method of claim 5, wherein the step S15 is achieved by:

in the reaction chamber of the HWCVD system, under the second predetermined temperature and the predetermined pressure, with the second mixed gas, growing the unintentionally doped 3C-SiC cap layer on the Si face of the 4H-SiC barrier layer through three-dimensional island growth; and when a thickness of the 3C-SiC cap layer reaches a fourth predetermined thickness value, cutting off supply of silane ($SiH_4$) and propane ($C_3H_8$) to the second mixed gas, so as to keep etching the upper surface of the 3C-SiC cap layer using hydrogen ($H_2$);

whereby the 3C-SiC cap layer and the Si face 4H-SiC barrier layer form the SiC heterojunction interface, thereby exciting the 2DHG.

7. The method of claim 6, wherein the step S16 is achieved by:

using inductively coupled plasma (ICP) etching to create, at each of two opposite sides of a multi-layer SiC heterojunction, a respective gate trench for forming a longitudinally-conductive channel and a respective drain trench for enabling ohmic contact between a drain and a 2DEG laterally-conductive channel, wherein the multi-layer SiC heterojunction is composed of a SiC heterojunction formed by the 4H-SiC transition layer and the 3C-SiC potential well layer and a SiC heterojunction formed by the 4H-SiC barrier layer and the 3C-SiC cap layer;

using ion implantation to implant phosphorus (P) ions into the 3C-SiC cap layer below a source so as to form an $N^+$-doped region for modulating a threshold voltage of the HEMT and to implant P ions into the multi-layer SiC heterojunction left to the drain so as to form $N^+$-doped regions for creating the ohmic contact between the 2DEG laterally-conductive channel and the drain;

using electron-beam evaporation to deposit alloy films in the $N^+$-doped regions, respectively, so as to form sources and drains for the ohmic contact;

using electron-beam evaporation to apply an insulating gate medium into the gate trench and to deposit a Schottky metal gate, wherein the insulating gate medium is one of $SiO_2$, $Al_2O_3$, $HfO_2$, and $La_2O_3$;

coating a protective layer outside the multi-layer SiC heterojunction; and coating a light shielding layer on the protective layer to prevent lateral light incidence and consequent impact on device performance.

8. A silicon carbide (SiC) heterojunction normally-off high-electron-mobility transistor (HEMT), prepared using the method of any of claims 1 through 7.

9. A method for preparing a silicon carbide (SiC) heterojunction normally-off high-electron-mobility transistor (HEMT), comprising steps of:

S21: selecting an unintentionally doped n-type 4H-SiC chip as a substrate;

S22: growing a 4H-SiC transition layer on an upper surface of the substrate through isomorphic epitaxial growth, and growing a C face on an upper surface of the 4H-SiC transition layer through epitaxial growth;

S23: growing a first potential well layer of unintentionally doped 3C-SiC on the C face of the 4H-SiC transition layer;

S24: growing a first barrier layer of n-type doped 4H-SiC on an upper surface of the 3C-SiC first potential well layer, and growing a C face on an upper surface of the 4H-SiC first barrier layer through epitaxial growth;

S25: growing a second potential well layer of unintentionally doped 3C-SiC on the C face of the 4H-SiC first barrier layer;

S26: growing a second barrier layer of n-type doped 4H-SiC on an upper surface of the 3C-SiC second potential well layer through epitaxial growth, and growing a Si face on an upper surface of the 4H-SiC second barrier layer through epitaxial growth;

S27: growing an unintentionally doped 3C-SiC cap layer on the Si face of the 4H-SiC second barrier layer; and S28: producing electrodes and protective films, so as to obtain a 3C-SiC/4H-SiC heterojunction normally-off double-channel high-electron-mobility transistor.

10. A silicon carbide (SiC) heterojunction normal-off high-electron-mobility transistor (HEMT), prepared using the method of claim 9.

* * * * *